(12) United States Patent
Fujii

(10) Patent No.: US 10,600,567 B2
(45) Date of Patent: Mar. 24, 2020

(54) MULTILAYER CAPACITOR

(71) Applicant: Murata Manufacturing Co., Ltd., Nagaokakyo-shi, Kyoto-fu (JP)

(72) Inventor: Yasuo Fujii, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/233,268

(22) Filed: Dec. 27, 2018

(65) Prior Publication Data

US 2019/0131068 A1 May 2, 2019

Related U.S. Application Data

(63) Continuation of application No. 15/014,161, filed on Feb. 3, 2016, now Pat. No. 10,186,377.

(30) Foreign Application Priority Data

Feb. 13, 2015 (JP) .................................. 2015-026199

(51) Int. Cl.
*H01G 4/012* (2006.01)
*H01G 4/30* (2006.01)
*H01G 4/35* (2006.01)
*H01G 4/232* (2006.01)
*H05K 3/34* (2006.01)

(52) U.S. Cl.
CPC ............ *H01G 4/012* (2013.01); *H01G 4/232* (2013.01); *H01G 4/30* (2013.01); *H01G 4/35* (2013.01); *H05K 3/3442* (2013.01); *H05K 2201/10015* (2013.01)

(58) Field of Classification Search
None
See application file for complete search history.

(56) References Cited

U.S. PATENT DOCUMENTS

| | | | | | |
|---|---|---|---|---|---|
| 6,038,121 | A | * | 3/2000 | Naito | H01G 4/232 |
| | | | | | 361/303 |
| 6,282,079 | B1 | * | 8/2001 | Nagakari | H01G 4/232 |
| | | | | | 361/303 |
| 6,324,047 | B1 | * | 11/2001 | Hayworth | H01G 4/35 |
| | | | | | 361/302 |
| 6,331,930 | B1 | * | 12/2001 | Kuroda | H01G 4/012 |
| | | | | | 361/303 |

(Continued)

OTHER PUBLICATIONS

Fujii, "Multilayer Capacitor", U.S. Appl. No. 15/014,161, filed Feb. 3, 2016.

*Primary Examiner* — Dion Ferguson
(74) *Attorney, Agent, or Firm* — Keating & Bennett, LLP

(57) ABSTRACT

A multilayer ceramic capacitor includes a capacitor body and first to fourth outer connectors. The capacitor body includes dielectric layers and conductor layers, first and second principal surfaces facing each other in a height direction, first and second side surfaces facing each other in a length direction, and third and fourth side surfaces facing each other in a width direction. The first to fourth outer connectors cover portions of the first to fourth side surfaces, respectively. In a case where L0, W0, and H0 are maximum external dimensions of the multilayer ceramic capacitor in the length direction, the width direction, and the height direction, respectively, L0, W0, and H0 satisfy a condition of about $2.67 \leq L0/H0$ and a condition of about $1/1.72 \leq L0/W0 \leq$ about $1.72$.

8 Claims, 44 Drawing Sheets

(56) References Cited

U.S. PATENT DOCUMENTS

| | | | | |
|---|---|---|---|---|
| 6,407,906 B1* | 6/2002 | Ahiko | ............... | H01G 4/012 |
| | | | | 361/303 |
| 7,495,885 B2* | 2/2009 | Togashi | ............ | H01G 4/232 |
| | | | | 361/306.1 |
| 7,630,188 B2* | 12/2009 | Anthony | ............ | H01G 4/005 |
| | | | | 361/111 |
| 9,318,260 B2* | 4/2016 | Fujii | ............ | H05K 1/181 |
| 2008/0106847 A1* | 5/2008 | Ota | ............ | H01G 4/012 |
| | | | | 361/306.3 |
| 2010/0103586 A1* | 4/2010 | Tang | ............ | H01G 4/232 |
| | | | | 361/301.4 |
| 2017/0287641 A1* | 10/2017 | Wu | ............ | H01G 4/012 |

\* cited by examiner

FIG. 8

| | VERIFICATION EXAMPLE 1 | VERIFICATION EXAMPLE 2 | VERIFICATION EXAMPLE 3 | VERIFICATION EXAMPLE 4 | VERIFICATION EXAMPLE 5 |
|---|---|---|---|---|---|
| L0 [mm] | 0.78 | 0.85 | 0.90 | 0.93 | 0.95 |
| W0 [mm] | 0.78 | 0.85 | 0.90 | 0.93 | 0.95 |
| H0 [mm] | 0.43 | 0.37 | 0.34 | 0.32 | 0.31 |
| L1 [mm] | 0.61 | 0.68 | 0.73 | 0.76 | 0.78 |
| W1 [mm] | 0.61 | 0.68 | 0.73 | 0.76 | 0.78 |
| H1 [mm] | 0.33 | 0.27 | 0.24 | 0.22 | 0.21 |
| L0/W0 [−] | 1.00 | 1.00 | 1.00 | 1.00 | 1.00 |
| L0/H0 [−] | 1.81 | 2.30 | 2.67 | 2.92 | 3.09 |
| W0/H0 [−] | 1.81 | 2.30 | 2.67 | 2.92 | 3.09 |
| O. A. SOUND PRESSURE LEVEL (RELATIVE VALUE) [DB] | 0 | −3.8 | −8.6 | −18.0 | −34.2 |

FIG. 10

| | VERIFICATION EXAMPLE 6 | VERIFICATION EXAMPLE 7 | VERIFICATION EXAMPLE 8 | VERIFICATION EXAMPLE 9 | VERIFICATION EXAMPLE 10 | VERIFICATION EXAMPLE 11 | VERIFICATION EXAMPLE 12 |
|---|---|---|---|---|---|---|---|
| L0 [mm] | 0.95 | 1.00 | 1.10 | 1.25 | 1.30 | 1.35 | 1.40 |
| W0 [mm] | 0.95 | 0.90 | 0.82 | 0.73 | 0.71 | 0.68 | 0.66 |
| H0 [mm] | 0.31 | 0.31 | 0.31 | 0.31 | 0.31 | 0.31 | 0.31 |
| L1 [mm] | 0.78 | 0.83 | 0.93 | 1.08 | 1.13 | 1.18 | 1.23 |
| W1 [mm] | 0.78 | 0.73 | 0.65 | 0.56 | 0.54 | 0.51 | 0.49 |
| H1 [mm] | 0.21 | 0.21 | 0.21 | 0.21 | 0.21 | 0.21 | 0.21 |
| L0/W0 [-] | 1.00 | 1.11 | 1.34 | 1.72 | 1.83 | 2.00 | 2.12 |
| L0/H0 [-] | 3.09 | 3.25 | 3.58 | 4.03 | 4.23 | 4.35 | 4.55 |
| W0/H0 [-] | 3.09 | 2.93 | 2.67 | 2.34 | 2.31 | 2.18 | 2.15 |
| O.A. SOUND PRESSURE LEVEL (RELATIVE VALUE) [DB] | −33.0 | −28.6 | −18.5 | −6.0 | −3.6 | 0 | +2.6 |

FIG. 12

| | VERIFICATION EXAMPLE 13 | VERIFICATION EXAMPLE 14 | VERIFICATION EXAMPLE 15 | VERIFICATION EXAMPLE 16 | VERIFICATION EXAMPLE 17 | VERIFICATION EXAMPLE 18 | VERIFICATION EXAMPLE 19 | VERIFICATION EXAMPLE 20 | VERIFICATION EXAMPLE 21 | VERIFICATION EXAMPLE 22 |
|---|---|---|---|---|---|---|---|---|---|---|
| L0 [mm] | 0.95 | 0.95 | 0.95 | 0.95 | 0.95 | 0.95 | 0.95 | 0.95 | 0.95 | 0.95 |
| W0 [mm] | 0.95 | 0.95 | 0.95 | 0.95 | 0.95 | 0.95 | 0.95 | 0.95 | 0.95 | 0.95 |
| H0 [mm] | 0.31 | 0.31 | 0.31 | 0.31 | 0.31 | 0.31 | 0.31 | 0.31 | 0.31 | 0.31 |
| L1 [mm] | 0.73 | 0.74 | 0.75 | 0.76 | 0.77 | 0.78 | 0.79 | 0.79 | 0.80 | 0.82 |
| W1 [mm] | 0.73 | 0.74 | 0.75 | 0.76 | 0.77 | 0.78 | 0.79 | 0.79 | 0.80 | 0.82 |
| H1 [mm] | 0.24 | 0.23 | 0.22 | 0.22 | 0.21 | 0.20 | 0.20 | 0.20 | 0.19 | 0.19 |
| (L1/H1)/(L0/H0) [-] | 1.00 | 1.05 | 1.12 | 1.14 | 1.20 | 1.24 | 1.27 | 1.30 | 1.35 | 1.43 |
| (W1/H1)/(W0/H0) [-] | 1.00 | 1.05 | 1.12 | 1.14 | 1.20 | 1.24 | 1.27 | 1.30 | 1.35 | 1.43 |
| O.A. SOUND PRESSURE LEVEL (RELATIVE VALUE) [DB] | 0 | −0.4 | −4.9 | −6.0 | −11.2 | −9.1 | −6.0 | −3.1 | 0 | +5.2 |

MULTILAYER CAPACITOR

BACKGROUND OF THE INVENTION

1. Field of the Invention

The present invention relates to multilayer capacitors each including a capacitor body and a plurality of outer connectors provided on outer surfaces of the capacitor body, wherein the capacitor body includes a plurality of dielectric layers and a plurality of conductor layers stacked alternatingly.

2. Description of the Related Art

Generally, as a multilayer capacitor, a multilayer ceramic capacitor includes a capacitor body formed by stacking alternatingly a plurality of dielectric layers composed of a ceramic material and a plurality of conductor layers composed of an electrically conductive material. The multilayer ceramic capacitor is configured so as to have electrostatic capacitance provided by these stacked plurality of dielectric layers and plurality of conductor layers.

In recent years, with advancements in performance of electronic devices, higher capacitance multilayer ceramic capacitors are being developed. In high capacitance multilayer ceramic capacitors, ceramic materials having high dielectric constants such as barium titanate ($BaTiO_3$) and the like are used as the dielectric material.

These high dielectric constant ceramic materials have piezoelectricity and an electrostrictive property. Thus, in the multilayer ceramic capacitor including dielectric layers composed of the high dielectric constant ceramic material, a mechanical distortion occurs when voltage is applied.

Therefore, when an alternating-current voltage, a direct-current voltage on which an alternating-current component is superposed, or the like is applied to a high capacitance multilayer ceramic capacitor mounted on a wiring board, vibration occurs due to the mechanical distortion occurring in the ceramic material. When this vibration propagates to the wiring board, a circuit board vibrates.

Here, in a case where the propagated vibration causes the circuit board to vibrate at a frequency within the range from about 20 Hz and about 20 KHz that is an audible frequency range, audible noise occurs. This audible noise is what is called squeaking (acoustic noise). This kind of audible noise is problematic in various electronic devices such as television receivers, personal computers, mobile communication terminals such as typified by cellular phones and smartphones, and the like, which include multilayer ceramic capacitors as electronic components.

To suppress occurrence of such audible noise, for example, Japanese Unexamined Patent Application Publication No. 2010-45085 proposes an arrangement of four elongated substantially cuboid multilayer ceramic capacitors, which are mounted on a wiring board, in accordance with a predetermined layout rule in such a way that vibrations propagating from the respective multilayer ceramic capacitors are partially cancelled on the wiring board.

However, in the case where an arrangement such as disclosed in the Japanese Unexamined Patent Application Publication No. 2010-45085 is adopted, the number of the multilayer ceramic capacitors always needs to be the integral multiple of four, and furthermore, these multilayer ceramic capacitors need to be arranged in accordance with the predetermined layout rule. These greatly reduce flexibility in circuit board designing and pose a problem. Particularly, in the mobile communication terminals and the like, such as typified by cellular phones and smartphones, there is strong demand of high-density packaging of electronic components. In some cases, it is difficult to adopt an arrangement such as disclosed in the Japanese Unexamined Patent Application Publication No. 2010-45085.

SUMMARY OF THE INVENTION

Accordingly, preferred embodiments of the present invention provide a multilayer capacitor capable of significantly reducing or preventing the occurrence of audible noise without reducing flexibility in circuit board design.

A multilayer capacitor according to a first aspect of various preferred embodiments of the present invention includes a capacitor body and a plurality of outer connectors provided on outer surfaces of the capacitor body, the capacitor body including a plurality of dielectric layers and a plurality of conductor layers stacked alternatingly along a height direction. The capacitor body includes a first principal surface and a second principal surface that face each other in the height direction, a first side surface and a second side surface that face each other in a length direction that is perpendicular or substantially perpendicular to the height direction, and a third side surface and a fourth side surface that face each other in a width direction that is perpendicular or substantially perpendicular to both the height direction and the length direction. The plurality of outer connectors includes a first outer connector that covers a portion of the first side surface, a second outer connector that covers a portion of the second side surface, a third outer connector that covers a portion of the third side surface, and a fourth outer connector that covers a portion of the fourth side surface. The plurality of conductor layers includes a plurality of first conductor layers connected to the first outer connector and a plurality of second conductor layers connected to at least one of the second to fourth outer connectors and not connected to the first outer connector. The capacitor body includes an effective portion defined by electrostatic capacitance portions stacked along the height direction, each of the electrostatic capacitance portions being defined by one of the plurality of first conductor layers and one of the plurality of second conductor layers disposed opposite to each other with one of the plurality of dielectric layers interposed therebetween. In a case where L0 is a maximum external dimension of the multilayer capacitor in the length direction, W0 is a maximum external dimension of the multilayer capacitor in the width direction, and H0 is a maximum external dimension of the multilayer capacitor in the height direction, the multilayer capacitor according to the first aspect of various preferred embodiments of the present invention satisfies a condition of about 2.67≤L0/H0 and further satisfies a condition of about 1/1.72 ≤L0/W0≤about 1.72.

In the multilayer capacitor according to the first aspect of various preferred embodiments of the present invention, the plurality of first conductor layers may be connected to the first and second outer connectors, and the plurality of second conductor layers may be connected to the third and fourth outer connectors.

In the multilayer capacitor according to the first aspect of various preferred embodiments of the present invention, the plurality of first conductor layers may be connected to the first and third outer connectors, and the plurality of second conductor layers may be connected to the second and fourth outer connectors.

In the multilayer capacitor according to the first aspect of various preferred embodiments of the present invention, the plurality of first conductor layers may be connected to the first outer connector, and the plurality of second conductor layers may be connected to the second outer connector, and in that case, the third and fourth outer connectors may be neither connected to the plurality of first conductor layers nor the plurality of second conductor layers.

In the multilayer capacitor according to the first aspect of various preferred embodiments of the present invention, the first outer connector may further cover a portion of the third side surface in addition to the portion of the first side surface. The second outer connector may further cover a portion of the fourth side surface in addition to the portion of the second side surface. The third outer connector may further cover a portion of the second side surface in addition to the portion of the third side surface. The fourth outer connector may further cover a portion of the first side surface in addition to the portion of the fourth side surface.

In the multilayer capacitor according to the first aspect of various preferred embodiments of the present invention, the first outer connector may further cover a portion of the first principal surface and a portion of the second principal surface in addition to the portion of the first side surface. The second outer connector may further cover a portion of the first principal surface and a portion of the second principal surface in addition to the portion of the second side surface. The third outer connector may further cover a portion of the first principal surface and a portion of the second principal surface in addition to the portion of the third side surface. The fourth outer connector may further cover a portion of the first principal surface and a portion of the second principal surface in addition to the portion of the fourth side surface.

In the multilayer capacitor according to the first aspect of various preferred embodiments of the present invention, a centerline of a portion of the first outer connector, which covers the first side surface, in the width direction may be spaced from a center position of the first side surface. A centerline of a portion of the second outer connector, which covers the second side surface, in the width direction may be spaced from a center position of the second side surface.

In the multilayer capacitor according to the first aspect of various preferred embodiments of the present invention, a centerline of a portion of the third outer connector, which covers the third side surface, in the length direction may be spaced from a center position of the third side surface. A centerline of a portion of the fourth outer connector, which covers the fourth side surface, in the length direction may be spaced from a center position of the fourth side surface.

A multilayer capacitor according to a second aspect of various preferred embodiments of the present invention includes a capacitor body and a plurality of outer connectors provided on outer surfaces of the capacitor body, the capacitor body including a plurality of dielectric layers and a plurality of conductor layers stacked alternatingly along a height direction. The capacitor body includes a first principal surface and a second principal surface that face each other in the height direction, a first side surface and a second side surface that face each other in a length direction that is perpendicular or substantially perpendicular to the height direction, and a third side surface and a fourth side surface that face each other in a width direction that is perpendicular or substantially perpendicular to both the height direction and the length direction. The plurality of outer connectors includes a first outer connector and a second outer connector, the first outer connector covering at least a portion of the first side surface, a portion of the third side surface, and a portion of the fourth side surface, the second outer connector covering at least a portion of the second side surface, a portion of the third side surface, and the portion of the fourth side surface. The plurality of conductor layers includes a plurality of first conductor layers connected to the first outer connector and a plurality of second conductor layers connected to the second outer connector. The capacitor body includes an effective portion defined by electrostatic capacitance portions stacked along the height direction, each of the electrostatic capacitance portions being defined by one of the plurality of first conductor layers and one of the plurality of second conductor layers being disposed opposite to each other with one of the plurality of dielectric layers interposed therebetween. In a case where L0 is a maximum external dimension of the multilayer capacitor in the length direction, W0 is a maximum external dimension of the multilayer capacitor in the width direction, and H0 is a maximum external dimension of the multilayer capacitor in the height direction, the multilayer capacitor according to the second aspect of various preferred embodiments of the present invention satisfies a condition of about 2.67≤L0/H0 and further satisfies a condition of about 1/1.72≤L0/W0≤about 1.72.

In the multilayer capacitor according to the second aspect of various preferred embodiments of the present invention, the first outer connector further may further cover a portion of the first principal surface and a portion of the second principal surface in addition to the at least a portion of the first side surface, the portion of the third side surface, and the portion of the portion of fourth side surface. The second outer connector may further cover a portion of the first principal surface and a portion of the second principal surface in addition to the at least a portion of the second side surface, the portion of the third side surface, and the portion of the portion of fourth side surface.

In the multilayer capacitor according to the second aspect of various preferred embodiments of the present invention, a centerline of a portion of the first outer connector, which covers the first side surface, in the width direction may be spaced from a center position of the first side surface. A centerline of a portion of the second outer connector, which covers the second side surface, in the width direction may be spaced from a center position of the second side surface.

A multilayer capacitor according to a third aspect of various preferred embodiments of the present invention includes a capacitor body and a plurality of outer connectors provided on outer surfaces of the capacitor body, the capacitor body including a plurality of dielectric layers and a plurality of conductor layers stacked alternatingly along a height direction. The capacitor body includes a first principal surface and a second principal surface that face each other in the height direction, a first side surface and a second side surface that face each other in a length direction that is perpendicular or substantially perpendicular to the height direction, and a third side surface and a fourth side surface that face each other in a width direction that is perpendicular or substantially perpendicular to both the height direction and the length direction. The plurality of outer connectors includes a first outer connector that covers a portion of the first side surface, a second outer connector that covers a portion of the second side surface, a third outer connector that covers a portion of the third side surface, a fourth outer connector that covers a portion of the fourth side surface, a fifth outer connector that covers a portion of the first side surface, a sixth outer connector that covers a portion of the second side surface, a seventh outer connector that covers a portion of the third side surface, and an eighth outer connector that covers a portion of the fourth side surface. The plurality of conductor layers includes a plurality of first conductor layers connected to the first to fourth outer connectors and a plurality of second conductor layers connected to the fifth to eighth outer connectors. The capacitor body includes an effective portion defined by electrostatic capacitance portions stacked along the height direction, each of the electrostatic capacitance portions being defined by one of the plurality of first conductor layers and one of the plurality of second conductor layers being disposed opposite to each other with one of the plurality of dielectric layers interposed therebetween. In a case where L0 is a maximum external dimension of the multilayer capacitor in the length direction, W0 is a maximum external dimension of the multilayer capacitor in the width direction, and H0 is a maximum external dimension of the multilayer capacitor in the height direction, the multilayer capacitor according to the third aspect of various preferred embodiments of the present invention satisfies a condition of about 2.67≤L0/H0 and further satisfies a condition of about 1/1.72≤L0/W0≤about 1.72.

In the multilayer capacitor according to the third aspect of various preferred embodiments of the present invention, each one of the first and fifth outer connectors may further cover a portion of the first principal surface and a portion of the second principal surface in addition to the portion of the first side surface. Each one of the second and sixth outer connectors may further cover a portion of the first principal surface and a portion of the second principal surface in addition to the portion of the second side surface. Each one of the third and seventh outer connectors may further cover a portion of the first principal surface and a portion of the second principal surface in addition to the portion of the third side surface. Furthermore, each one of the fourth and eighth outer connectors may further cover a portion of the first principal surface and a portion of the second principal surface in addition to the portion of the fourth side surface.

In the multilayer capacitor according to the third aspect of various preferred embodiments of the present invention, a centerline of a portion of the first outer connector, which covers the first side surface, in the width direction and a centerline of a portion of the fifth outer connector, which covers the first side surface, in the width direction may be spaced from a center position of the first side surface. A centerline of a portion of the second outer connector, which covers the second side surface, in the width direction and a centerline of a portion of the sixth outer connector, which covers the second side surface, in the width direction may be spaced from a center position of the second side surface.

In the multilayer capacitor according to the third aspect of various preferred embodiments of the present invention, a centerline of a portion of the third outer connector, which covers the third side surface, in the length direction and a centerline of a portion of the seventh outer connector, which covers the third side surface, in the length direction may be spaced from a center position of the third side surface. A centerline of a portion of the fourth outer connector, which covers the fourth side surface, in the length direction and a centerline of a portion of the eighth outer connector, which covers the fourth side surface, in the length direction may be spaced from a center position of the fourth side surface.

In the multilayer capacitor according to the third aspect of various preferred embodiments of the present invention, a distance between the first outer connector and the fifth outer connector in the width direction may be greater than a distance between the first outer connector and the third side surface in the width direction and a distance between the fifth outer connector and the fourth side surface in the width direction. A distance between the second outer connector and the sixth outer connector in the width direction may also be greater than a distance between the second outer connector and the fourth side surface in the width direction and a distance between the sixth outer connector and the third side surface in the width direction. A distance between the third outer connector and the seventh outer connector in the length direction may also be greater than a distance between the third outer connector and the second side surface in the length direction and a distance between the seventh outer connector and the first side surface in the length direction. Furthermore, a distance between the fourth outer connector and the eighth outer connector in the length direction may also be greater than a distance between the fourth outer connector and the first side surface in the length direction and a distance between the eighth outer connector and the second side surface in the length direction.

In a case where L1 is a dimension of the effective portion in the length direction and H1 is a dimension of the effective portion in the height direction, it is preferable that the multilayer capacitors according to the first to third aspects of various preferred embodiments of the present invention further satisfy a condition of L0/H0<L1/H1<1.35×(L0/H0). In this case, it is preferable that the multilayer capacitors according to the first to third aspects of various preferred embodiments of the present invention further satisfy a condition of W0/H0<W1/H1<1.35×(W0/H0) where W1 is a dimension of the effective portion in the width direction.

In a case where L1 is a dimension of the effective portion in the length direction and H1 is a dimension of the effective portion in the height direction, it is preferable that the multilayer capacitors according to the first to third aspects of various preferred embodiments of the present invention further satisfy a condition of 1.14×(L0/H0)≤L1/H1≤1.27×(L0/H0). In this case, it is preferable that the multilayer capacitors according to the first to third aspects of various preferred embodiments of the present invention further satisfy a condition of 1.14×(W0/H0)≤W1/H1≤1.27×(W0/H0) where W1 is a dimension of the effective portion in the width direction.

According to various preferred embodiments of the present invention, multilayer capacitors capable of significantly reducing or preventing the occurrence of audible noise without reducing flexibility in circuit board designing are provided.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 8 is a table describing test conditions and test results of a first verification test.

FIG. 10 is a table describing test conditions and test results of a second verification test.

FIG. 12 is a table describing test conditions and test results of a third verification test.

DETAILED DESCRIPTION OF THE PREFERRED EMBODIMENTS

Figure 1:
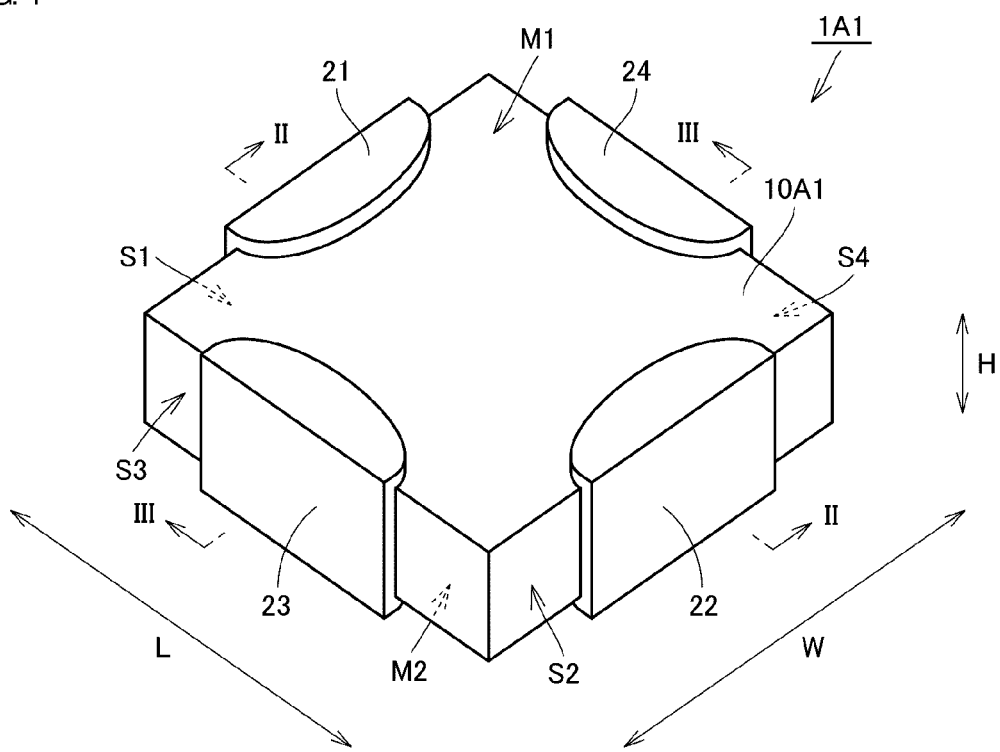
FIG. 1 is a perspective view of a multilayer ceramic capacitor according to Preferred Embodiment 1 of the present invention.

Hereinafter, preferred embodiments of the present invention will be described in detail with reference to the drawings. Multilayer capacitors to which preferred embodiments of the present invention may be applicable include multilayer ceramic capacitors in which ceramic materials are used as the dielectric material, multilayer-type metalized film capacitors in which resin films are used as the dielectric material, and the like. However, of these multilayer capacitors, following preferred embodiments describe exemplary cases where the present invention is applied to multilayer ceramic capacitors. In the following preferred embodiments, the same reference numerals are assigned to the same or common portions in the drawings, and description thereof will not be repeated.

Preferred Embodiment 1

Figure 2:
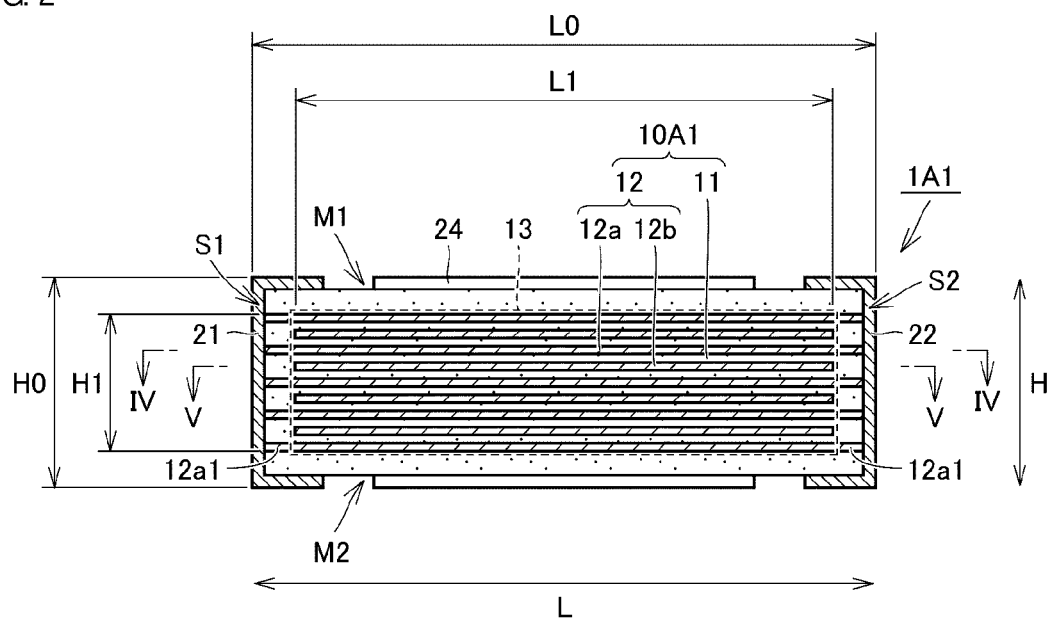
FIG. 2 is a cross-sectional view along line II-II illustrated in FIG. 1.
Figure 3:
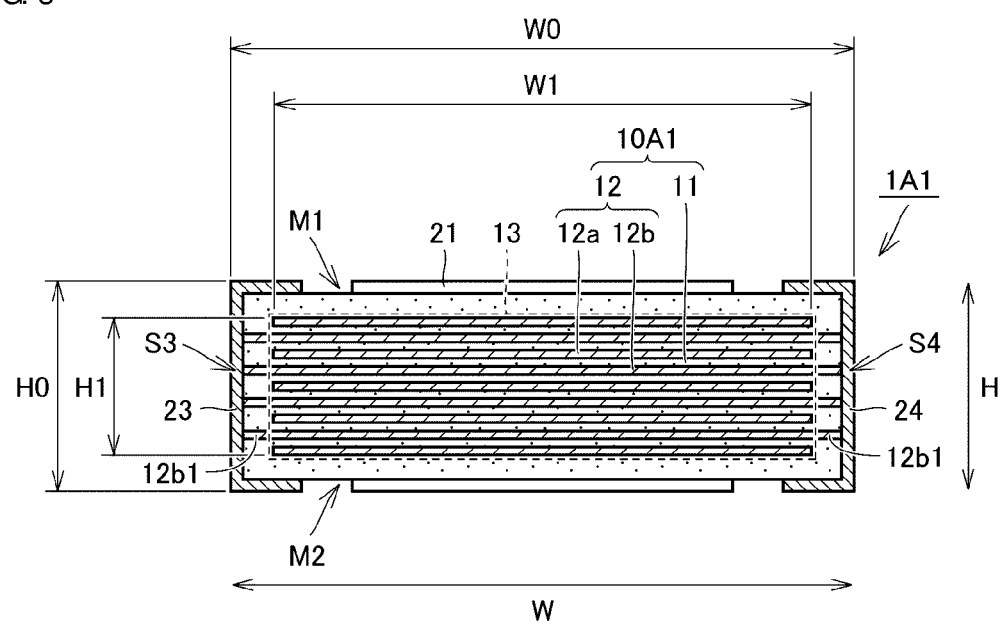
FIG. 3 is a cross-sectional view along line III-III illustrated in FIG. 1.
Figure 4:
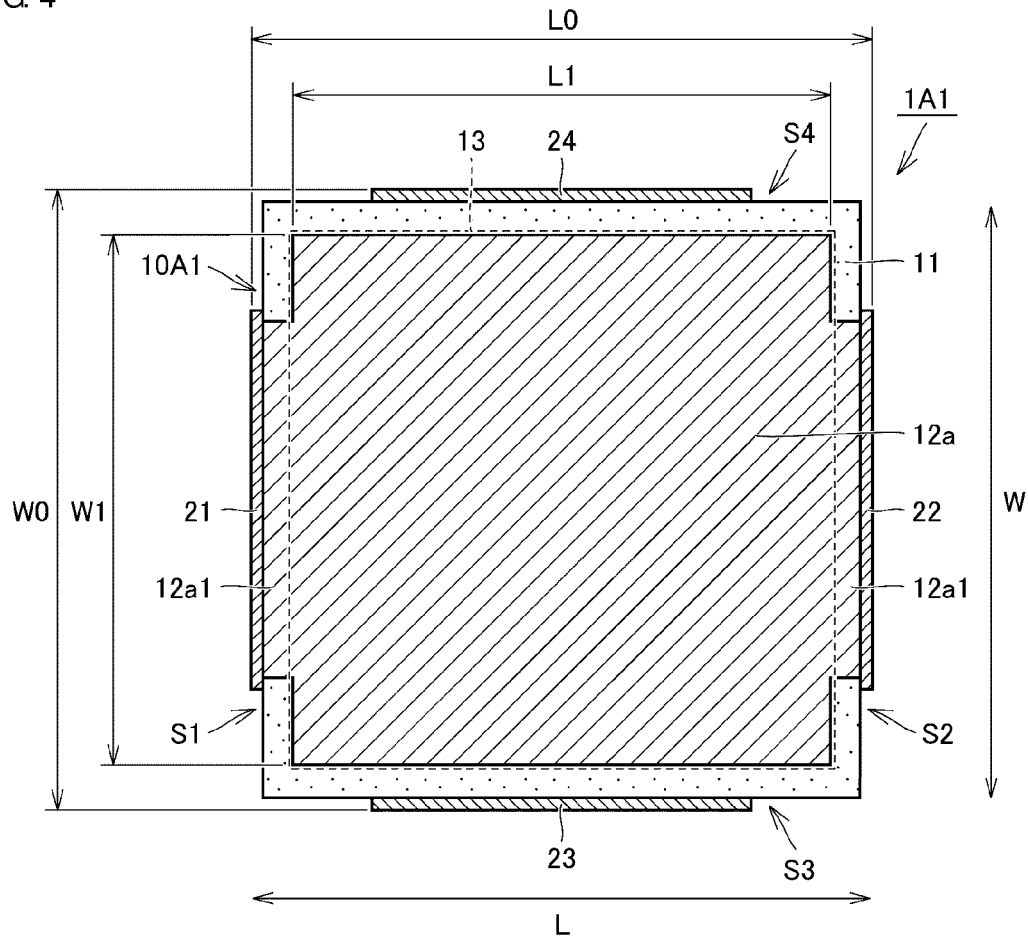
FIG. 4 is a cross-sectional view along line IV-IV illustrated in FIG. 2.
Figure 5:
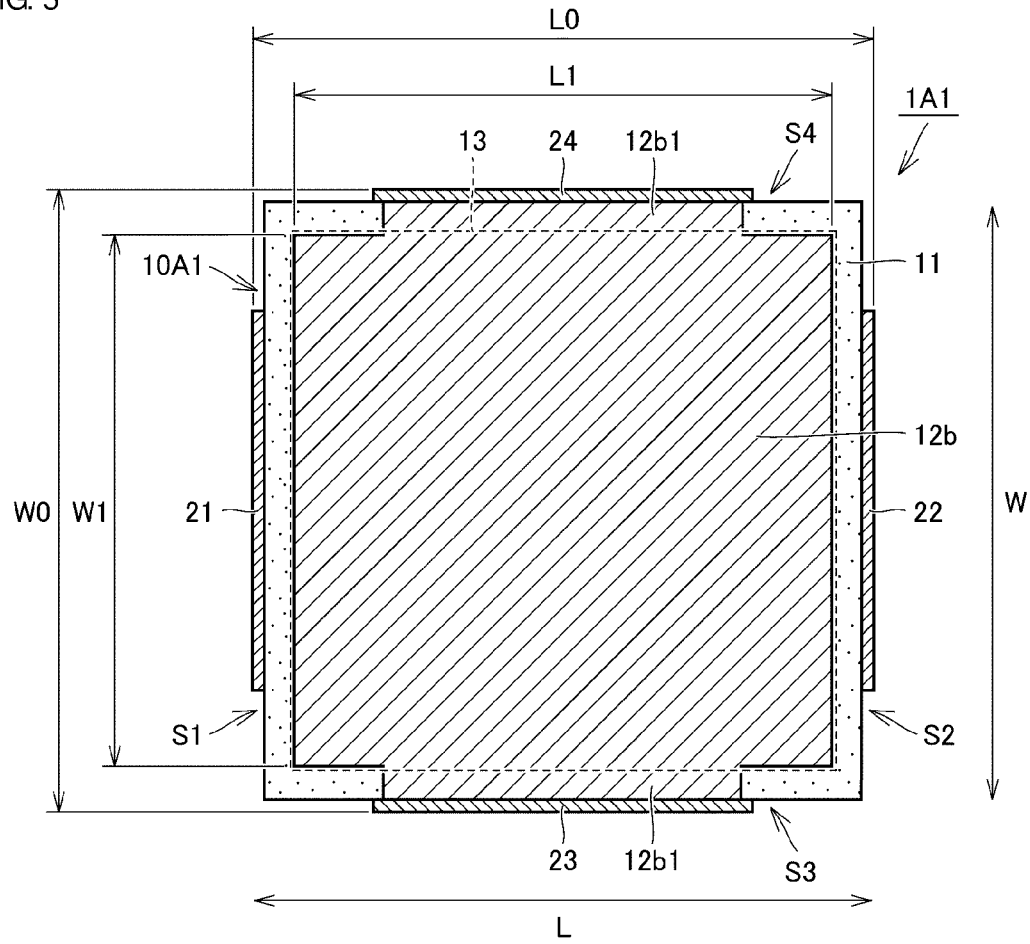
FIG. 5 is a cross-sectional view along line V-V illustrated in FIG. 2.
Figure 6:
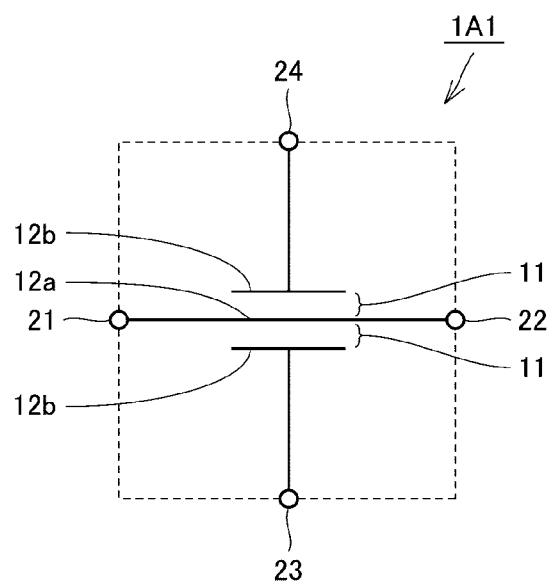
FIG. 6 is a diagram depicting an equivalent circuit of the multilayer ceramic capacitor depicted in FIG. 1.

FIG. 1 is a perspective view depicting a multilayer ceramic capacitor according to Preferred Embodiment 1 of the present invention. FIG. 2 and FIG. 3 are cross-sectional views along line II-II and line III-III illustrated in FIG. 1, respectively. FIG. 4 and FIG. 5 are cross-sectional views along line IV-IV and line V-V illustrated in FIG. 2, respectively. FIG. 6 is a diagram depicting an equivalent circuit of the multilayer ceramic capacitor depicted in FIG. 1. First, a multilayer ceramic capacitor 1A1 according to the present preferred embodiment is described with reference to FIG. 1 to FIG. 6.

As depicted in FIG. 1 to FIG. 5, the multilayer ceramic capacitor 1A1 is an electronic component having a thin, substantially cuboid shape as a whole, and includes a capacitor body 10A1 and first to fourth outer connectors 21 to 24 that define and function as a plurality of outer connectors.

The capacitor body 10A1 has a thin, substantially cuboid shape. The substantially cuboid shape described herein includes a shape of the capacitor body 10A1 whose corners and crests are rounded, a shape of the capacitor body 10A1 in which minute steps or irregularities that are negligible as a whole are provided on its outer surfaces, and the like.

The first to fourth outer connectors 21 to 24 are separately provided from each other in such a way that each outer connector covers predetermined portions of the outer surfaces of the capacitor body 10A1. These first to fourth outer connectors 21 to 24 each have a film-shaped structure.

As depicted in FIG. 2 and FIG. 3, the capacitor body 10A1 includes a plurality of dielectric layers 11 and a plurality of conductor layers 12, which are alternatingly stacked along a predetermined direction. The dielectric layer 11 is composed of, for example, a ceramic material whose primary component is barium titanate. The dielectric layer 11 may further contain Mn compounds, Mg compounds, Si compounds, Co compounds, Ni compounds, rare-earth compounds, and the like. These compounds are accessory components of ceramic powder to be used as a raw material of ceramic sheet, which will be described later. On the other hand, the conductor layer 12 is composed of, for example, a metal material typified by Ni, Cu, Ag, Pd, Ag—Pd alloy, Au, and the like.

The capacitor body 10A1 is produced by preparing a plurality of raw material sheets, stacking the plurality of raw material sheets, and pressure-bonding and firing the plurality of raw material sheets thus stacked. The raw material sheet is produced by printing conducting paste that becomes the conductor layer 12 on a surface of a ceramic sheet (so-called green sheet) that becomes the dielectric layer 11.

The material of the dielectric layer 11 is not limited to the ceramic material whose primary component is barium titanate. Alternatively, other high dielectric constant ceramic materials (for example, a material whose primary component is $CaTiO_3$, $SrTiO_3$, or the like) may also be selected as the material of the dielectric layer 11. Similarly, the material of the conductor layer 12 is not limited to the metal material. Alternatively, other electrically conducting materials may also be selected as the material of the conductor layer 12.

The first to fourth outer connectors 21 to 24 each include a conductor film such as, for example, a multilayer film including a sintered metal layer and a plated layer. The sintered metal layer is formed, for example, by sintering paste of Cu, Ni, Ag, Pd, Ag—Pd alloy, Au, and the like. The plated layer includes, for example, a Ni plated layer and a Sn plated layer that covers the Ni plated layer. The plated layer may alternatively be a Cu plated layer or an Au plated layer. Alternatively, the first to fourth outer connectors 21 to 24 may each be defined by only a plated layer.

Still further, for the first to fourth outer connectors 21 to 24, electrically conductive resin paste containing a metal component and a resin component may be utilized. In the case where the electrically conductive resin paste is used for the first to fourth outer connectors 21 to 24, the resin component contained in the electrically conductive resin paste produces an absorbing effect of vibration occurred in the capacitor body 10A1, thus making it possible to effectively damp the vibration propagating outward from the capacitor body 10A1.

Here, with reference to FIG. 1 to FIG. 5, a stacking direction of the dielectric layers 11 and the conductor layers 12 is defined as a height direction H, an extending direction of one of two perpendicular or substantially perpendicular axes that are perpendicular or substantially perpendicular to the height direction H is defined as a length direction L, and an extending direction of the other axis of the two perpendicular or substantially perpendicular axes is defined as a width direction W. These terms are used for describing the direction of the multilayer ceramic capacitor 1A1 in the following description.

As depicted in FIG. 1 to FIG. 5, the capacitor body 10A1 having a substantially cuboid shape has, as outer surfaces, a first principal surface M1 and a second principal surface M2 that face each other in the height direction H, a first side surface S1 and a second side surface S2 that face each other in the length direction L, and a third side surface S3 and a fourth side surface S4 that face each other in the width direction W.

The first outer connector 21 covers a portion of the first side surface S1 (near a center portion in the width direction W), and further covers a portion of the first principal surface M1 and a portion of the second principal surface M2 in portions adjacent to the center portion of the first side surface S1.

The second outer connector 22 covers a portion of the second side surface S2 (near a center portion in the width direction W), and further covers a portion of the first principal surface M1 and a portion of the second principal surface M2 in portions adjacent to the center portion of the second side surface S2.

The third outer connector 23 covers a portion of the third side surface S3 (near a center portion in the length direction L), and further covers a portion of the first principal surface M1 and a portion of the second principal surface M2 in portions adjacent to the center portion of the third side surface S3.

The fourth outer connector 24 covers a portion of the fourth side surface S4 (near a center portion in the length direction L), and further covers a portion of the first principal surface M1 and a portion of the second principal surface M2 in portions adjacent to the center portion of the fourth side surface S4.

As depicted in FIG. 2 to FIG. 5, the plurality of conductor layers 12 includes a plurality of first conductor layers 12a connected to the first outer connector 21 and the second outer connector 22 and a plurality of second conductor layers 12b connected to the third outer connector 23 and the fourth outer connector 24.

As depicted in FIG. 4, the first conductor layer 12a has a substantially rectangular shape when it is viewed along the height direction H, and includes a pair of extended portions 12a1 at predetermined locations around its outer circumference. As depicted in FIG. 2 and FIG. 4, one of the pair of extended portions 12a1 is extended in the length direction L so as to reach the first side surface S1, and is connected to the first outer connector 21 provided on the first side surface S1. On the other hand, the other of the pair of extended portions 12a1 is extended in the length direction L so as to reach the second side surface S2, and is connected to the second outer connector 22 provided on the second side surface S2.

As depicted in FIG. 5, the second conductor layer 12b has a substantially rectangular shape when it is viewed along the height direction H, and includes a pair of extended portions 12b1 at predetermined locations around its outer circumference. As depicted in FIG. 3 and FIG. 5, one of the pair of extended portions 12b1 is extended in the width direction W so as to reach the third side surface S3, and is connected to the third outer connector 23 provided on the third side surface S3. On the other hand, the other of the pair of extended portions 12b1 is extended in the width direction W so as to reach the fourth side surface S4, and is connected to the fourth outer connector 24 provided on the fourth side surface S4.

As depicted in FIG. 2 and FIG. 3, the first conductor layer 12a and the second conductor layer 12b are arranged alternatingly along the height direction H. In this way, an electrostatic capacitance portion is defined at a portion where one of the plurality of first conductor layers 12a and one of the plurality of second conductor layers 12b are arranged opposite to each other with one of the plurality of the dielectric layers 11 interposed therebetween, and stacking a plurality of such electrostatic capacitance portions along the height direction H defines an effective portion 13 that determines the electrostatic capacitance of the multilayer ceramic capacitor 1A1 inside the capacitor body 10A1.

Here, the first conductor layer 12a and the second conductor layer 12b are arranged adjacent to each other in the height direction H and face each other at their substantially rectangular portions in planar view. These substantially rectangular portions are portions excluding the extended portion 12a1 and the extended portion 12b1 extending from the first conductor layer 12a and the second conductor layer 12b, respectively. Accordingly, the effective portion 13 has a thin, substantially cuboid shape.

As mentioned above, the effective portion 13 is buried inside the capacitor body 10A1. As a result, as depicted in FIG. 2 to FIG. 5, the effective portion 13 is interposed between protection portions that are primarily defined by portions of the dielectric layers 11.

Specifically, the effective portion 13 is interposed between a pair of height-direction protection portions in the height direction H, between a pair of length-direction protection portions in the length direction L, and between a pair of width-direction protection portions in the width direction W.

In the multilayer ceramic capacitor 1A1 having the configuration described above, the first to fourth outer connectors 21 to 24 are each connected to the first conductor layers 12a or the second conductor layers 12b, both of which define the electrostatic capacitance portion. These first to fourth outer connectors 21 to 24 are connectors planned to be electrically connected to a circuit provided on a wiring board on which the multilayer ceramic capacitor 1A1 is mounted. Thus, these first to fourth outer connectors 21 to 24 define and function as so-called outer electrodes and define and function as portions to electrically and mechanically connect to the wiring board via a joining material such as solder and the like.

On the other hand, the first conductor layer 12a and the second conductor layer 12b are both portions defining the electrostatic capacitance portion. Thus, the first conductor layer 12a and the second conductor layer 12b define and function as so-called internal electrode layers. The plurality of conductor layers 12 provided inside the capacitor body 10A1 may include a conductor layer that does not correspond to the first conductor layer 12a or the second conductor layer 12b that define and function as the internal electrode layers. The conductor layer that does not define and function as the internal conductor layer may be, for example, a layer for improving joining strength between the outer connector and the capacitor body, a layer that suppresses diffusion of a constituent from the height-direction protection portion to the effective portion, and the like.

The multilayer ceramic capacitor 1A1 having the configuration is a multilayer capacitor of a type that is typically referred to as a feed-through capacitor, and an equivalent circuit thereof is such as depicted in FIG. 6. In other words, the first outer connector 21 and the second outer connector 22 are electrically continuous within the multilayer ceramic capacitor 1A1 via the first conductor layer 12a, thus defining so-called feed-through electrodes. On the other hand, the electrostatic capacitance portion that is defined by the dielectric layer 11 between the first conductor layer 12a and the second conductor layer 12b being located between the first outer connector 21 and the second outer connector 22 that define and function as the feed-through electrodes and the third outer connector 23 and the fourth outer connector 24.

The feed-through capacitor having such a structure results in the electrostatic capacitance portion being located close to the conductor layer connecting the feed-through electrodes. This allows the electrostatic capacitance portion to connect to a signal line without any additional wiring, thus reducing an equivalent series inductance (ESL) that is a parasitic component of a multilayer capacitor.

In a case where the multilayer ceramic capacitor 1A1 is used as a decoupling capacitor to be installed in a DC/DC converter, the first outer connector 21 and the second outer connector 22 are electrically connected to a power line, and the third outer connector 23 and the fourth outer connector 24 are each electrically connected to ground (ground line).

Here, with reference to FIG. 1 to FIG. 5, in the multilayer ceramic capacitor 1A1 according to the present preferred embodiment, in a case where L0, W0, and H0 are the maximum external dimension in the length direction L, the maximum external dimension in the width direction W, and the maximum external dimension in the height direction H of the multilayer ceramic capacitor 1A1, respectively, L0, W0, and H0 satisfy a condition of about $2.67 \leq L0/H0$ (hereinafter, this will be referred to as a first condition) and further satisfy a condition of about $1/1.72 \leq L0/W0 \leq$ about $1.72$ (hereinafter, this will be referred to as a second condition).

In the multilayer ceramic capacitor 1A1 according to the present preferred embodiment, in a case where L1 and H1 are the dimension in the length direction L and the dimension in the height direction H of the effective portion 13, respectively, L1 and H1 and the L0 and H0 further satisfy a condition of $L0/H0 < L1/H1 < 1.35 \times (L0/H0)$ (hereinafter, this will be referred to as a third condition).

Still furthermore, in the multilayer ceramic capacitor 1A1 according to the present preferred embodiment, in a case where W1 is the dimension of the effective portion 13 in the width direction W, W1 and the W0, H0 and H1 further satisfy a condition of $W0/H0 < W1/H1 < 1.35 \times (W0/H0)$ (hereinafter, this will be referred to as a fourth condition).

In the multilayer ceramic capacitor 1A1 according to the present preferred embodiment, the L0, H0, L1 and H1 further satisfy a condition of $1.14 \times (L0/H0) \leq L1/H1 \leq 1.27 \times (L0/H0)$ (hereinafter, this will be referred to as a fifth condition).

Furthermore, in the multilayer ceramic capacitor 1A1 according to the present preferred embodiment, the W0, H0, W1 and H1 further satisfy a condition of $1.14 \times (W0/H0) \leq W1/H1$ $1.27 \times (W0/H0)$ (hereinafter, this will be referred to as a sixth condition).

The occurrence of audible noise is significantly reduced or prevented without reducing flexibility in circuit board designing by satisfying the first and second conditions. Here, the reason why the flexibility in circuit board designing is not reduced is because, in the case where the multilayer ceramic capacitor 1A1 according to the present preferred embodiment satisfies the first and second conditions, the multilayer ceramic capacitor 1A1 has a structure such that the multilayer ceramic capacitor 1A1 alone already makes audible noise difficult to occur because of a reason described below. Accordingly, there is no need to follow the predetermined layout rule when arranging other multilayer ceramic capacitors close to the multilayer ceramic capacitor 1A1, and there is no need to arrange a predetermined number of multilayer ceramic capacitors in the vicinity of the multilayer ceramic capacitor 1A1. Thus, the mounting location of the multilayer ceramic capacitor 1A1 may be freely set at an arbitrary location on the wiring board.

In addition to satisfying the first and second conditions, the occurrence of audible noise may be more effectively reduced or prevented by satisfying the third condition or by satisfying the fourth condition in addition to the third condition. Still furthermore, in addition to satisfying the first and second conditions, the occurrence of audible noise may be still more effectively reduced or prevented by satisfying the fifth condition or by satisfying the sixth condition in addition to the fifth condition.

These first to sixth conditions are determined based on test results of first to third verification tests, which will be described later. Particularly, a reason why the effect is obtained by satisfying the first and second conditions of these first to sixth conditions is as follows.

Figure 7:
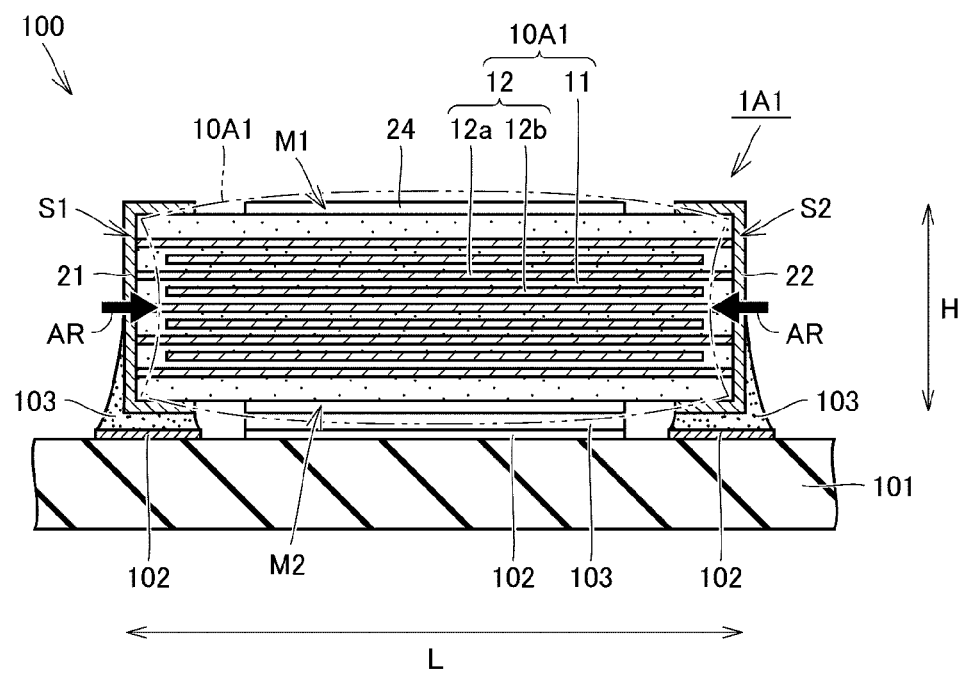
FIG. 7 is a schematic cross-sectional view of a circuit board including the multilayer ceramic capacitor depicted in FIG. 1.

FIG. 7 is a schematic cross-sectional view of a circuit board including the multilayer ceramic capacitor depicted in FIG. 1. Hereinafter, with reference to FIG. 7, a circuit board 100 is described as a configuration example of a component-mounted body including the multilayer ceramic capacitor 1A1 according to the present preferred embodiment, and furthermore, the reason why the effect is obtained by satisfying the first and second conditions is described in detail.

As depicted in FIG. 7, the circuit board 100 includes the multilayer ceramic capacitor 1A1 according to the present preferred embodiment and a wiring board 101 defining and functioning as a component-receiving body on which the multilayer ceramic capacitor 1A1 is mounted.

Specifically, the wiring board 101 includes four lands 102 that are arranged separately from each other on its principal surface. The first to fourth outer connectors 21 to 24 of the multilayer ceramic capacitor 1A1 are respectively arranged so as to oppose the four lands 102. These four lands 102 are correspondingly matched to the first to fourth outer connectors 21 to 24 and joined via solder 103 that is a joining material placed therebetween. As the joining material, a material other than the solder 103 may alternatively be used.

Here, in the circuit board 100, when an alternating-current voltage, a direct-current voltage on which an alternating-current component is superposed, or the like is applied to the multilayer ceramic capacitor 1A1, a mechanical distortion occurs in the dielectric layer 11 since the dielectric layer 11 has piezoelectricity and electrostrictive property. At that time, distortion such as depicted in FIG. 7 with a dashed-two dotted line occurs in the capacitor body 10A1 of the multilayer ceramic capacitor 1A1.

In other words, when voltage is applied, the capacitor body 10A1 is distorted outward along the height direction H that is the stacking direction of the plurality of dielectric layers 11 and the plurality of the conductor layers 12. This distorts the first principal surface M1 and the second principal M2 in such a way that each center portion thereof swells outward. Along with the above, the capacitor body 10A1 is distorted inward along the length direction L and the width direction W (In the drawing, of distortions in the length direction L and the width direction W, only the distortion along the length direction L is schematically depicted with arrows AR). This distorts the first side surface S1, the second side surface S2, the third side surface S3, and the fourth side surface S4 in such a way that each center portion thereof contracts inward. At that time, the distortion occurred at corner portions of the capacitor body 10A1 having a substantially cuboid shape is relatively small.

Generally, in many cases, the multilayer ceramic capacitor has a thin, substantially cuboid external shape and has a structure such that the ratio of the maximum external dimensions thereof in the length direction, the width direction, and the height direction is about 2:1:1, for example, and that a pair of outer electrodes is provided at both end portions of the capacitor body thereof in the length direction. With regard to the shape of an effective portion formed inside the multilayer ceramic capacitor, the ratio of dimensions in the length direction, the width direction, and the height direction is about 2:1:1, for example, in many cases. As described above, typically, the number of stacking layers in a plurality of dielectric layers and a plurality of conductor layers, which constitute the effective portion, is increased in order to achieve enlargement of electrostatic capacitance by relatively increasing the dimension in the height direction (in other words, without making the multilayer ceramic capacitor extremely thin).

However, in the typically-configured multilayer ceramic capacitor, distortion occurred at the capacitor body along the height direction becomes much larger by the amount corresponding to an additional number of stacking layers of a plurality of dielectric layers and a plurality of conductor layers. Along with this, distortions that occur at the first side surface and the second side surface, which are located at both end portions in the length direction, also become larger. As a result, large distortion occurs at the outer electrodes provided at both the end portions in the length direction, which are joining portions with the wiring board defining and functioning as the component-receiving body. When this distortion is propagated to the wiring board as vibration via solder defining and functioning as a joining material, this vibration becomes a cause to increase audible noise.

On the other hand, when satisfying the first and second conditions, the multilayer ceramic capacitor 1A1 according to the present preferred embodiment has a structure such that, compared with the typically-configured multilayer ceramic capacitor, the maximum external dimension H0 in the height direction H is sufficiently small (in other word, thinner) relative to the maximum external dimension L0 in the length direction L and the maximum external dimension W0 in the width direction W, and the maximum external dimension W0 in the width direction W is relatively closer to the maximum external dimension L0 in the length direction L (in other words, the external shape is closer to a square when viewed along the height direction H).

Accordingly, in the multilayer ceramic capacitor 1A1 according to the present preferred embodiment, by keeping the numbers of stacking layers in the plurality of dielectric layers 11 and the plurality of conductor layers 12 relatively small, the distortion occurring at the capacitor body 10A1 along the height direction H is greatly reduced or prevented. Along with this, distortions that occur at the first side surface S1 and the second side surface S2, which are located at both end portions in the length direction L, are also significantly reduced or prevented (in other words, the level of distortions depicted in FIG. 7 by the arrows AR may be kept low or eliminated). Furthermore, distortions that occur at the third side surface S3 and the fourth side surface S4, which are located at both end portions in the width direction W, are also significantly reduced or prevented. As a result, no large distortion occurs at the first to fourth outer connectors 21 to 24 provided at both end portions in the length direction L and at both end portions in the width direction W, which are joining portions with the wiring board 101 defining and functioning as the component-receiving body. This makes it possible to significantly reduce or prevent the occurrence of audible noise at the circuit board 100.

In the multilayer ceramic capacitor 1A1 according to the present preferred embodiment, the number of stacking layers in the plurality of dielectric layers 11 and the plurality of conductor layers 12 is kept relatively small. However, as mentioned above, the multilayer ceramic capacitor 1A1 has a structure such that the maximum external dimension W0 in the width direction W is close to the maximum external dimension L0 in the length direction L. Thus, compared with the typically-configured multilayer ceramic capacitor, respective areas of the stacked plurality of dielectric layers 11 and plurality of conductor layers 12 at the effective portion 13 are relatively increased. In this sense, the enlargement of electrostatic capacitance is achieved.

The multilayer ceramic capacitor 1A1 according to the present preferred embodiment is less bulky on the wiring board by the amount saved on the external shape by being made thinner. This contributes to thinning of the circuit board 100, and as a result, contributes to downsizing of an electronic device on which the circuit board 100 is mounted.

In the multilayer ceramic capacitor 1A1 according to the present preferred embodiment, compared with the typically-configured multilayer ceramic capacitor, the first and second side surfaces S1 and S2 as well as the third and fourth side surfaces S3 and S4 are each covered with one of the first to fourth outer connectors 21 to 24, and each covered area thereof is larger. Furthermore, outer edges of the capacitor body 10A1 are held in the height direction H by these first to fourth outer connectors 21 to 24.

Accordingly, in the multilayer ceramic capacitor 1A1 according to the present preferred embodiment, the capacitor body 10A1 is in a state where the outer edges thereof are restrained by the first to fourth outer connectors 21 to 24 approximately evenly along the whole circumference in the height direction H. In this sense, the distortion that occurs at the capacitor body 10A1 in the height direction H is greatly suppressed. Accordingly, distortions that occur at the first to fourth side surface S1 to S4 are also significantly reduced or prevented. In this sense also, the occurrence of audible noise is significantly reduced or prevented.

In addition, as mentioned above, the multilayer ceramic capacitor 1A1 according to the present preferred embodiment has a structure such that the maximum external dimension W0 in the width direction W is close to the maximum external dimension L0 in the length direction L. Thus, when voltage is applied, the first to fourth side surfaces S1 to S4 are each distorted by approximately the same amount. Accordingly, along with keeping the number of stacking layers in the plurality of dielectric layers 11 and the plurality of conductor layers 12 relatively small, the amount of distortion occurred when voltage is applied may be kept small simultaneously at all the first to fourth side surface S1 to S4. Furthermore, the occurrence of vibration along both the length direction L and the width direction W is significantly reduced or prevented at the wiring board 101 defining and functioning as the component-receiving body. Thus, the occurrence of audible noise is significantly reduced or prevented.

First Verification Test

Figure 9:
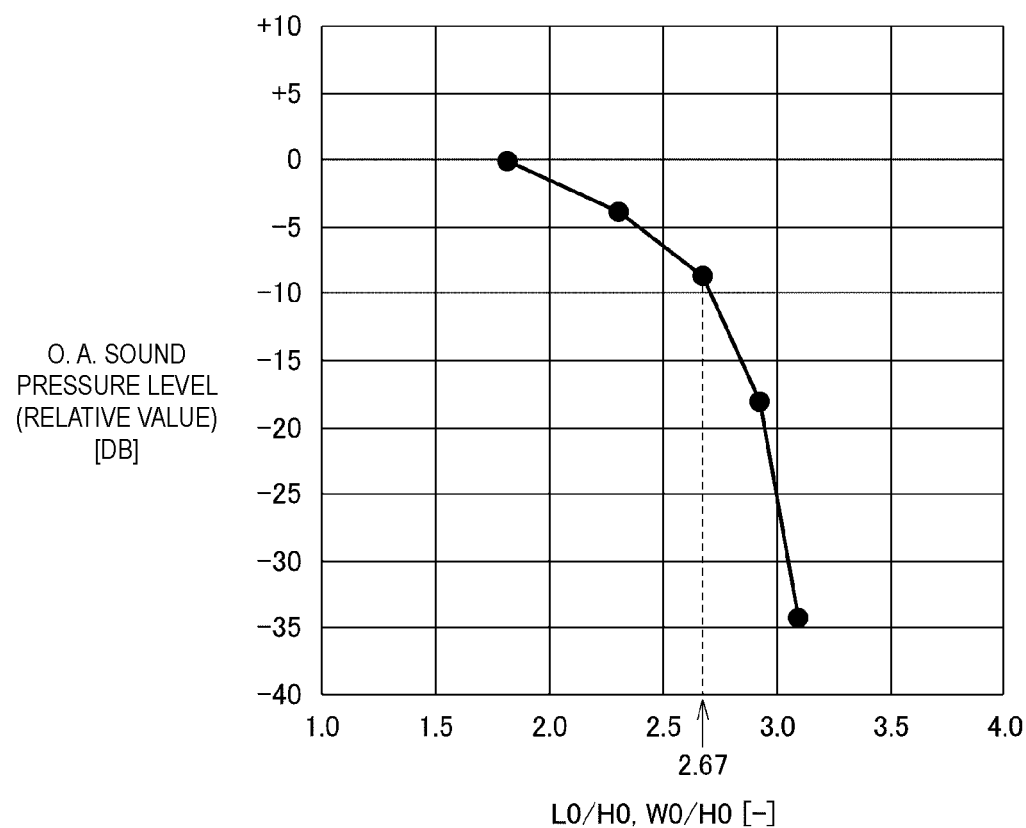
FIG. 9 is a chart depicting test results of the first verification test.

FIG. 8 is a table describing test conditions and test results of the first verification test. FIG. 9 is a chart depicting the test results of the first verification test.

The first verification test is to check how audible noise occurred at a circuit board defining and functioning as a component-receiving body changes when H0 is varied in various ways while keeping L0 and W0 nearly the same size, where L0, W0, and H0 are the maximum external dimensions of multilayer ceramic capacitor in the length direction L, the width direction W, and the height direction H.

Sample Production Conditions

As depicted in FIG. 8, in the first verification test, five kinds of multilayer ceramic capacitors, verification examples 1 to 5, are produced in total. These verification examples 1 to 5 each have a basic configuration similar to that of the Preferred Embodiment 1. However, the verification examples 1 and 2 do not satisfy the first condition.

In these verification examples 1 to 5, the maximum external dimensions L0 and W0 of capacitor body in the length direction L and the width direction W are each set at about 0.78 mm, about 0.85 mm, about 0.90 mm, about 0.93 mm, and about 0.95 mm in design value rounded to two decimal places, and the maximum external dimension H0 of the capacitor body in the height direction H is set at about 0.43 mm, about 0.37 mm, about 0.34 mm, about 0.32 mm, and about 0.31 mm in design value rounded to two decimal places.

In all the verification examples 1 to 5, the thickness of each one of the plurality of conductor layers (internal electrode layer) is set at about 0.52 μm in design value, the thickness of each one of the plurality of dielectric layers included in the effective portion is set at about 0.7 μm in design value, the thickness of each one of the pair of height-direction protection portions is set at about 32 μm in design value, the thicknesses of the pair of length-direction protection portions and the pair of width-direction protection portions are each set at about 60 μm in design value, the thicknesses of the first to fourth outer connectors on the first to fourth side surfaces are each set at about 25 μm in design value, the thicknesses of the first to fourth outer connectors on the first and second principal surfaces are each set at about 20 μm in design value, and the electrostatic capacitance of each verification example is set at about 4.3 μF in design value.

In these verification examples 1 to 5, the dimensions L1, W1, and H1 of the effective portion in design value in the length direction L, the width direction W, and the height direction H as well as L0/W0, L0/H0, and W0/H0, which are the ratios of the maximum external dimensions L0, H0, and W0, are as described in the table of FIG. 8. Here, these L1, W1, H1, L0/W0, L0/H0 and W0/H0 are described in values rounded to two decimal places. The dimensions of respective portions of the multilayer ceramic capacitors produced based on the design values are actually measured and determined to be in agreement with their corresponding design values.

Audible Noise Measurement Conditions

Audible noise occurred at a circuit board defining and functioning as a component-receiving body is measured by producing five kinds of circuit boards on which multilayer ceramic capacitors according to these verification examples 1 to 5 are respectively mounted on center portions of wiring boards under the same conditions; supplying a predetermined alternating current to each one of the multilayer ceramic capacitors according to the verification examples 1 to 5 that are respectively mounted on the five kinds of circuit boards; and measuring a sound pressure spectrum at a location about 3 mm away from the center portion of respective circuit board in the normal direction.

Here, as the wiring boards, a board having a size of about 100 mm×about 40 mm×about 1.6 mm preferably is used.

The wiring board is provided with lands at locations corresponding to the first to fourth outer connectors depending on the size of the verification example 1 to 5. As the joining material, solder is used. The dimensions of the lands to be connected to the first and second outer connectors are set at about L+0.25 mm in a direction parallel to the length direction L, and dimensions of the lands to be connected to the third and fourth outer connectors are set at about W+0.25 mm in a direction parallel to the width direction W, for example.

A frequency band of the sound pressure spectrum of audible noise to be measured is set at a range of about 0 to 10 kHz, and a sound pressure level of the audible noise is calculated as an over-all (O. A.) value that is an average value of sound pressure at this frequency band. The O. A. sound pressure levels in dB described in the chart of FIG. 8 are relative values when the measurement result of the verification example 1 is taken as zero. A negative value thereof represents a decrease in audible noise compared with the verification example 1 whereas a positive value represents an increase in audible noise compared with the verification example 1. A decrease of about 6 dB corresponds to a reduction of audible noise by half.

Test Results

As depicted in FIG. 8 and FIG. 9, in the first verification test, compared with the verification example 1, a sound pressure level of about −3.8 dB is obtained in the verification example 2, a sound pressure level of about −8.6 dB is obtained in the verification example 3, a sound pressure level of about −18.0 dB is obtained in the verification example 4, and a sound pressure level of about −34.2 dB is obtained in the verification example 5.

Here, as depicted in FIG. 9, there is a significant change in sound pressure level that is falling near the verification example 3. Thus, it is understandable that audible noise is largely suppressed by making L0/H0 equal to or larger than L0/H0=2.67 that is a condition this verification example 3 satisfies.

Accordingly, based on the results of the present first verification test, it is determined that the occurrence of audible noise is able to be significantly reduced or prevented by satisfying the condition of about 2.67≤L0/H0 that is the first condition.

Second Verification Test

Figure 11:
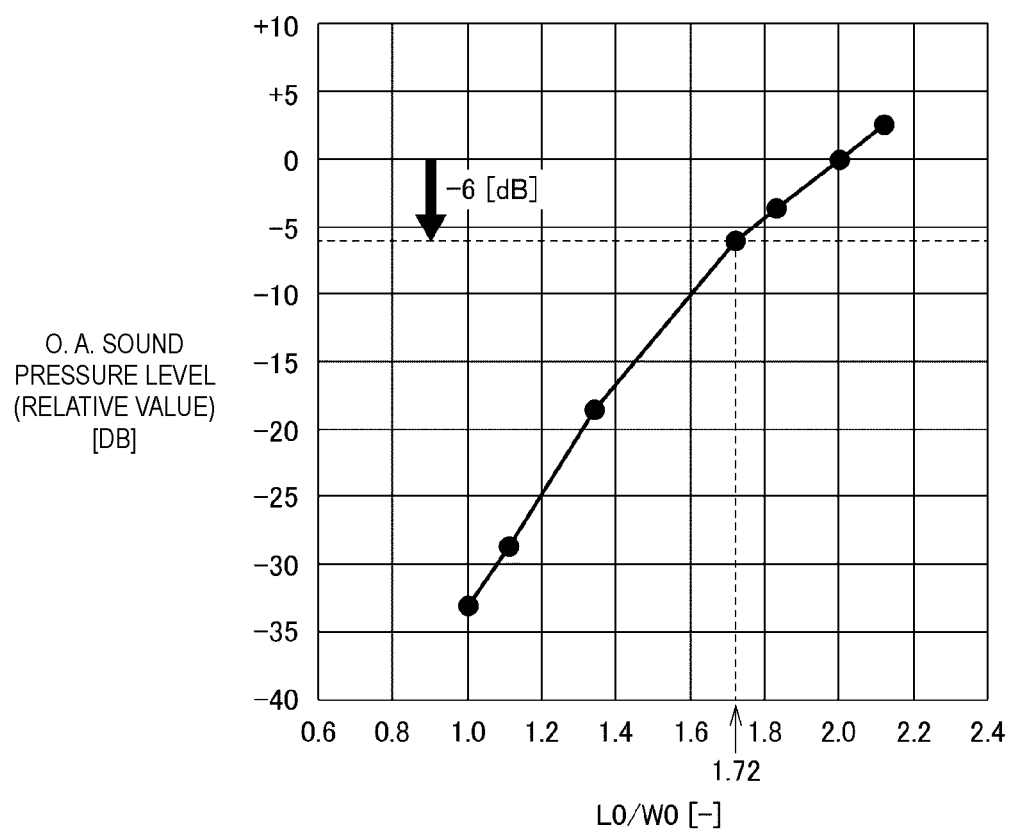
FIG. 11 is a chart depicting test results of the second verification test.

FIG. 10 is a table describing test conditions and test results of the second verification test. FIG. 11 is a chart depicting the test results of the second verification test.

The second verification test is to check how audible noise occurred at a circuit board defining and functioning as a component-receiving body changes when L0 and W0 are varied in various ways while keeping H0 nearly the same size, where L0, W0, and H0 are the maximum external dimensions of multilayer ceramic capacitor in the length direction L, the width direction W, and the height direction H, respectively.

Sample Production Conditions

As depicted in FIG. 10, in the second verification test, seven kinds of multilayer ceramic capacitors, verification examples 6 to 12, are produced in total. These verification examples 6 to 12 each have a basic configuration similar to that of the Preferred Embodiment 1. However, the verification examples 10 to 12 do not satisfy the second condition.

In these verification examples 6 to 12, the maximum external dimension L0 of the capacitor body in the length direction L is set at about 0.95 mm, about 1.00 mm, about 1.10 mm, about 1.25 mm, about 1.30 mm, about 1.35 mm, and about 1.40 mm in design value rounded to two decimal places; the maximum external dimension W0 of the capacitor body in the width direction W is set at about 0.95 mm, about 0.90 mm, about 0.82 mm, about 0.73 mm, about 0.71 mm, about 0.68 mm, and 0.66 mm in design value rounded to two decimal places; and the maximum external dimension H0 of the capacitor body in the height direction H is set at about 0.31 mm in design value rounded to two decimal places.

Other sample production conditions in the verification examples 6 to 12 are substantially the same as the corresponding sample production conditions in the first verification test.

In these verification examples 6 to 12, the dimensions L1, W1, and H1 of the effective portion in design value in the length direction L, the width direction W, and the height direction H as well as L0/W0, L0/H0, and W0/H0, which are the ratios of the maximum external dimensions L0, H0, and W0, are as described in the table of FIG. 8. Here, these L1, W1, H1, L0/W0, L0/H0, and W0/H0 are described in values rounded to two decimal places. The dimensions of respective portions of the multilayer ceramic capacitors produced based on the design values are actually measured and determined to be in agreement with their design values.

Audible Noise Measurement Conditions

Audible noise occurred at a circuit board defining and functioning as a component-receiving body is measured by producing seven kinds of circuit boards on which multilayer ceramic capacitors according to the verification examples 6 to 12 are mounted on respective center portions of wiring boards under the same conditions, and measuring audible noise at each one of the seven kinds of circuit boards using the same conditions as the audible noise measurement conditions in the first verification test. The multilayer ceramic capacitors according to the verification examples 6 to 12 are mounted on the wiring boards using such a manner similar to the one described in the first verification test.

The O. A. sound pressure levels in dB described in the chart of FIG. 10 are relative values when the measurement result of the verification example 11 is taken as zero. A negative value thereof represents a decrease in audible noise compared with the verification example 11 whereas a positive value represents an increase in audible noise compared with the verification example 11. Here, the verification example 11 has a structure such that an aspect ratio of the maximum external dimension L0 in the length direction L to the maximum external dimension W0 in the width direction W is substantially the same as that of the typically-configured multilayer ceramic capacitor.

Test Results

As depicted in FIG. 10 and FIG. 11, in the second verification test, compared with the verification example 11, a sound pressure level of about −33.0 dB is obtained in the verification example 6, a sound pressure level of about −28.6 dB is obtained in the verification example 7, a sound pressure level of about −18.5 dB is obtained in the verification example 8, a sound pressure level of about −6.0 dB is obtained in the verification example 9, a sound pressure level of about −3.6 dB is obtained in the verification example 10, and a sound pressure level of about +2.6 dB is obtained in the verification example 12.

Here, as depicted in FIG. 11, in the verification example 9, audible noise is reduced by half compared with the verification example 11 (in other words, −6 dB). Thus, it is understandable that audible noise is significantly reduced or prevented by making L0/W0 equal to or less than L0/W0=1.72 that is a condition this verification example 9 satisfies.

Accordingly, based on the results of the present second verification test, it is determined that the occurrence of audible noise is significantly reduced or prevented by satisfying the condition of about 1/1.72≤L0/W0≤about 1.72 that is the second condition. Of the second condition, the part "1/1.72≤L0/W0" is due to simple switching between L0 and W0 depending on how to define the length direction L and the width direction W of the multilayer ceramic capacitor.

Third Verification Test

Figure 13:
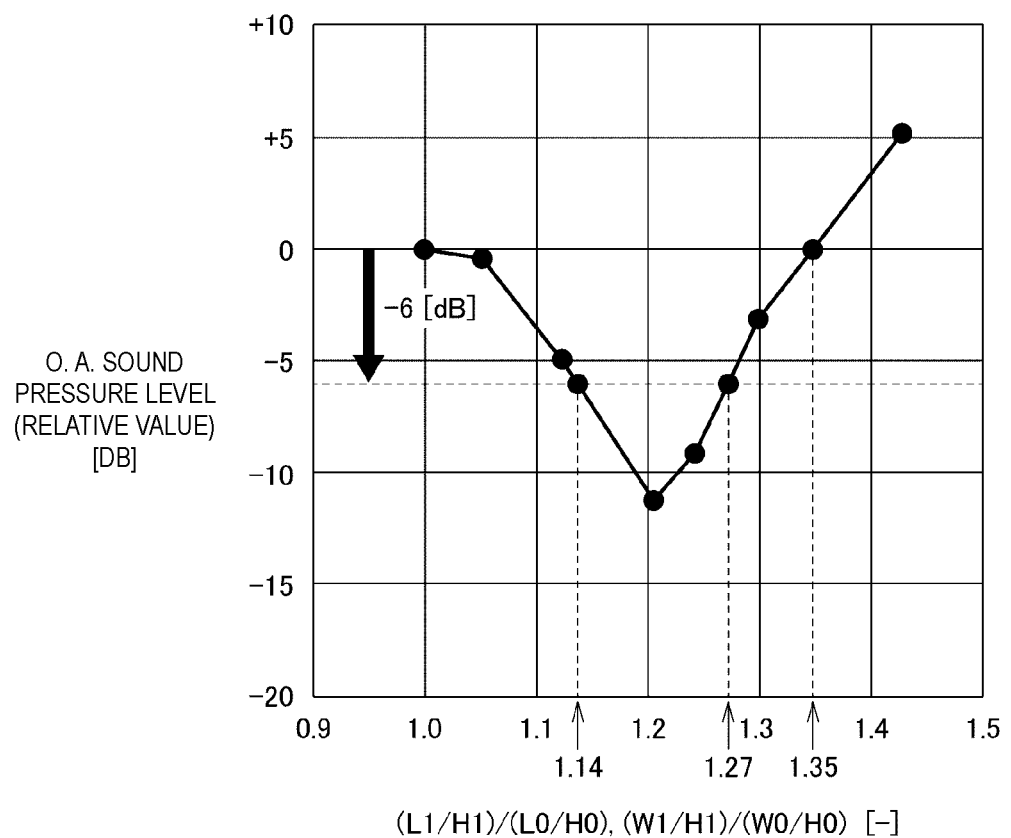
FIG. 13 is a chart depicting test results of the third verification test.

FIG. 12 is a table describing test conditions and test results of the third verification test. FIG. 13 is a chart depicting the test results of the third verification test.

The third verification test is to check how audible noise occurred at a circuit board defining and functioning as a component-receiving body changes when the dimension H1 of an effective portion in the height direction is varied in various ways after configuring a multilayer ceramic capacitor in such a way that the maximum external dimensions L0, W0, and H0 of the multilayer ceramic capacitor in the length direction L, the width direction W, and the height direction H are substantially constant and that the dimensions L1 and W1 of the effective portion in the length direction L and the width direction W are equal or substantially equal to each other.

Sample Production Condition

As depicted in FIG. 12, in the third verification test, ten kinds of multilayer ceramic capacitors, verification examples 13 to 22, are produced in total. The verification examples 13 to 22 each have a basic configuration similar to that of the Preferred Embodiment 1 and satisfy both the first and second conditions. However, the verification examples 13, 21, and 22 do not satisfy the third and fourth conditions. Furthermore, the verification examples 13 to 15 and 20 to 22 do not satisfy the fifth and sixth conditions.

In these verification examples 13 to 22, both the maximum external dimensions L0 and W0 of a capacitor body in the length direction L and the width direction W are set at about 0.95 mm in design value rounded to two decimal places, and the maximum external dimension H0 of the capacitor body in the height direction H is set at about 0.31 mm in design values rounded to two decimal places.

In these verification examples 13 to 22, both the dimensions L1 and W1 of the effective portion in the length direction L and the width direction W are set at about 0.73 mm, about 0.74 mm, about 0.75 mm, about 0.76 mm, about 0.77 mm, about 0.78 mm, about 0.79 mm, about 0.79 mm, about 0.80 mm, and about 0.82 mm in design value rounded to two decimal places; and the dimension H1 of the effective portion in the height direction H is set at about 0.24 mm, about 0.23 mm, about 0.22 mm, about 0.22 mm, about 0.21 mm, about 0.20 mm, about 0.20 mm, about 0.20 mm, about 0.19 mm, and about 0.19 mm in design value rounded to two decimal places.

Other sample production conditions in the verification examples 13 to 22 are substantially the same as the sample production conditions in the first verification test.

In these verification examples 13 to 22, (L1/H1)/(L0/H0) and (H1/H1)/(W0/H0), which are ratios of the maximum external dimensions L0, H0, and W0 and the dimensions L1, W1, and H1, are as described in the table of FIG. 12. Here, these (L1/H1)/(L0/H0) and (W1/H1)/(W0/H0) are described in value rounded to two decimal places. The dimensions of respective portions of the multilayer ceramic capacitor produced based on the design values are actually measured and determined to be in agreement with their design values.

Audible Noise Measurement Conditions

Audible noise occurred at a circuit board defining and functioning as a component-receiving body is measured by producing ten kinds of circuit boards on which multilayer ceramic capacitors according to the verification examples 13 to 22 are respectively mounted on center portions of wiring boards under the same conditions, and measuring audible noise at each one of the ten kinds of circuit boards using the same conditions as the audible noise measurement conditions in the first verification test. The multilayer ceramic capacitors according to the verification examples 13 to 22 are mounted on the wiring boards in a manner similar to the one described in the first verification test.

The O. A. sound pressure levels in dB described in the chart of FIG. 12 are relative values when the measurement result of the verification example 13 is taken as zero. A negative value thereof represents a decrease in audible noise compared with the verification example 13 whereas a positive value represents an increase in audible noise compared with the verification example 13. Here, the verification example 13 has a structure such that both the (L1/H1)/(L0/H0) and (W1/H1)/(W0/H0) are equal to about 1.00 (in other words, the external shape of the multilayer ceramic capacitor and the external shape of the effective portion are configured to be similar in shape).

Test Result

As depicted in FIG. 12 and FIG. 13, in the third verification test, compared with the verification example 13, a sound pressure level of about −0.4 dB is obtained in the verification example 14, a sound pressure level of about −4.9 dB is obtained in the verification example 15, a sound pressure level of about −6.0 dB is obtained in the verification example 16, a sound pressure level of about −11.2 dB is obtained in the verification example 17, a sound pressure level of about −9.1 dB is obtained in the verification example 18, a sound pressure level of about −6.0 dB is obtained in the verification example 19, a sound pressure level of about −3.1 dB is obtained in the verification example 20, a sound pressure level of about ±0 dB is obtained in the verification example 21, and a sound pressure level of about +5.2 dB is obtained in the verification example 22.

Here, as depicted in FIG. 13, in the verification examples 14 to 20, audible noise is reduced compared with the verification example 13 and the verification example 21 at which audible noise substantially equivalent thereof is measured. Thus, it is understandable that the occurrence of audible noise is further reduced or prevented by making L1/H1 equal or substantially equal to a value falling within the range between a condition of L0/H0=L1/H1 that the verification example 13 satisfies and a condition of L1/H1=1.35×(L0/H0) that the verification example 21 satisfies. In addition, it is understandable that the occurrence of audible noise is further reduced or prevented by making W1/H1 equal or substantially equal to a value falling within the range between a condition of W0/H0=W1/H1 that the verification example 13 satisfies and a condition of W1/H1=1.35×(W0/H0) that the verification example 21 satisfies.

Accordingly, based on the results of the present third verification test, it is determined that the occurrence of audible noise is further reduced or prevented by satisfying the condition of L0/H0<L1/H1<1.35×(L0/H0) that is the third condition, and furthermore, it is determined that the occurrence of audible noise is further reduced or prevented by satisfying the condition of W0/H0<W1/H1<1.35×(W0/H0) that is the fourth condition.

The results indicate that audible noise is able to be further reduced in the case where the dimension of the effective portion in the height direction is being decreased within in a certain range, compared with the case where the external shape of the multilayer ceramic capacitor and the external shape of the effective portion are configured to be similar in shape.

As depicted in FIG. 13, in the verification examples 16 and 19, audible noise is reduced by half compared with the verification example 13 and the verification example 21 at which audible noise substantially equivalent thereof is measured (in other words, −6 dB). Furthermore, in the verification examples 17 and 18, the audible noise is further reduced compared with the verification examples 16 and 19. Thus, it is understandable that the occurrence of audible noise is significantly further reduced by making L1/H1 equal or substantially equal to a value falling within the range between a condition of 1.14×(L0/H0)=L1/H1 that the verification example 16 satisfies and a condition of L1/H1=1.27×(L0/H0) that the verification example satisfies. In addition, it is understandable that the occurrence of audible noise is significantly further reduced by making W1/H1 equal or substantially equal to a value falling within the range between a condition of 1.14×W0/H0=W1/H1 that the verification example 16 satisfies and a condition of W1/H1=1.27×(W0/H0) that the verification example 19 satisfies.

Accordingly, based on the results of the present third verification test, it is determined that the occurrence of audible noise is significantly further reduced by satisfying the condition of 1.14×L0/H0≤L1/H1≤1.27×(L0/H0) that is the fifth condition, and furthermore, it is determined that the occurrence of audible noise is significantly further reduced by satisfying the condition of 1.14×W0/H0<W1/H1<1.27×(W0/H0) that is the sixth condition.

Figure 14A:
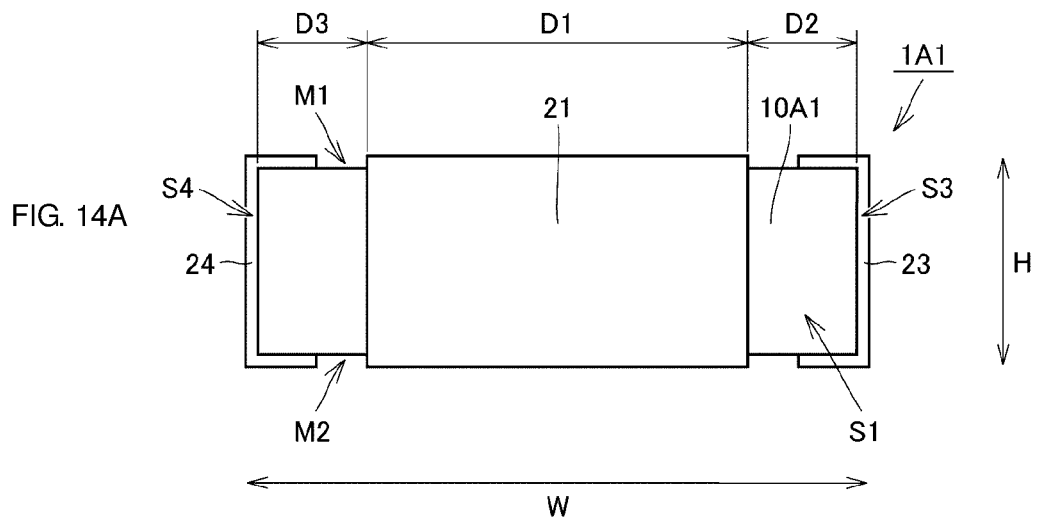
FIG. 14A, FIG. 14B, and 14C are side views for describing a preferred position arrangement of outer connectors of the multilayer ceramic capacitor depicted in FIG. 1.
Figure 14B:
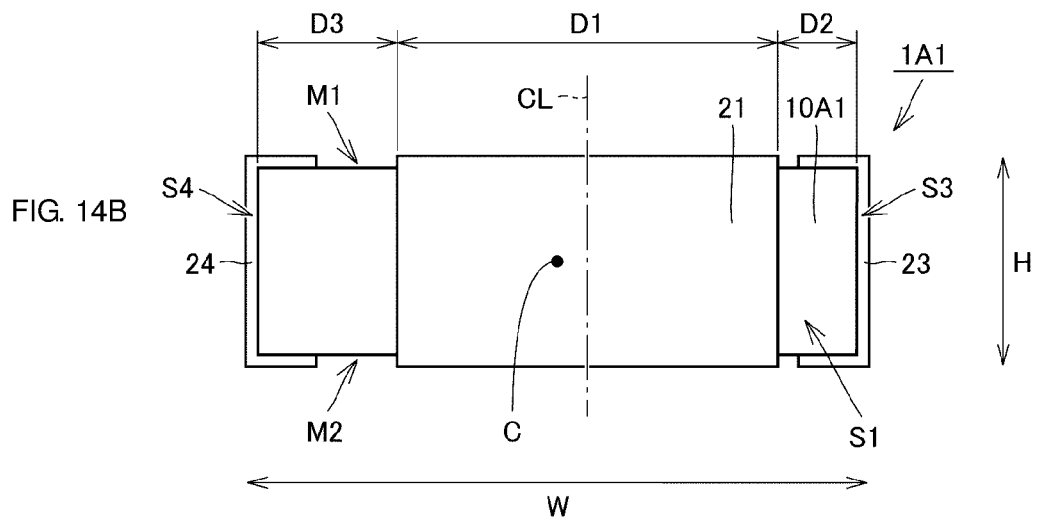
Figure 14C:
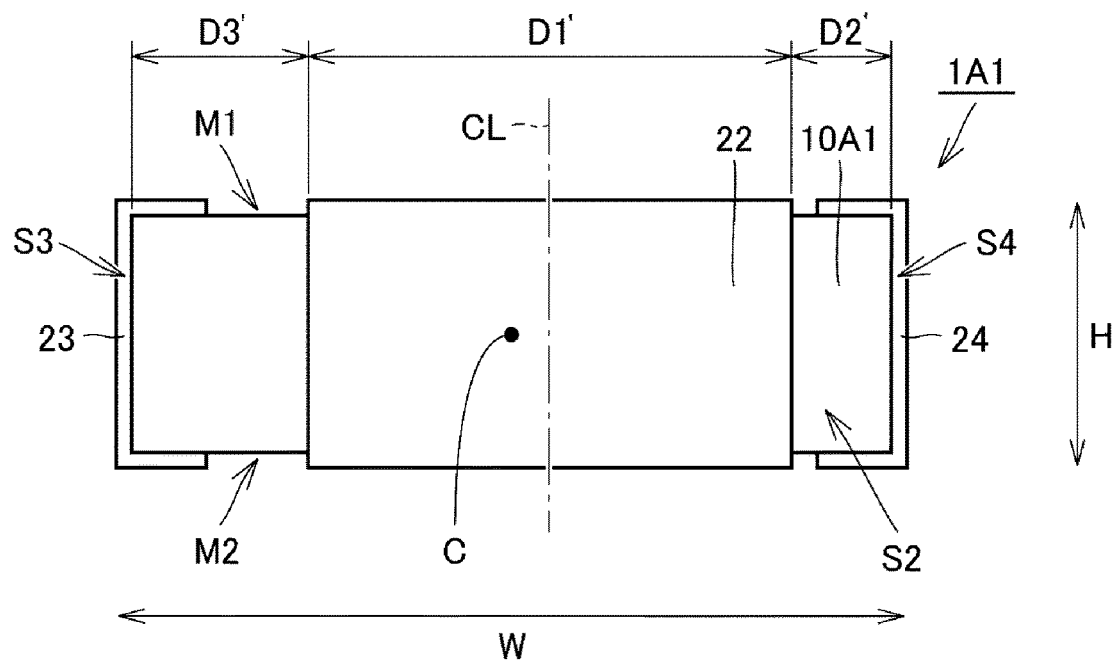

FIG. 14A, FIG. 14B, and FIG. 14C are side views for describing a preferred position arrangement of outer connectors in the multilayer ceramic capacitor depicted in FIG. 1. Hereinafter, with reference to FIG. 14A, FIG. 14B, and FIG. 14C, the preferred position arrangement of outer connectors in the present preferred embodiment is described. FIGS. 14A and 14B are side views when the first side surface S1 is viewed from front. It is preferable that the second to fourth side surfaces S2 to S4 are also configured based on the configuration of the first side surface S1. FIG. 14C is a side view when the second side surface S2 is viewed from front. All dimensions described below are, unless otherwise stated, the maximum dimensions of respective portions in the width direction W, and all distances described below are the minimum distances between portions in the width direction W.

With reference to FIG. 14A, from a viewpoint of that the distortion is significantly reduced or prevented by restraining the capacitor body 10A1 with the first outer connector 21, of the first outer connector 21, it is preferable to have a larger dimension D1 in the width direction W for the portion covering the first side surface S1. For example, the occurrence of audible noise is significantly reduced or prevented by making the dimension D1 larger than the total distance of distance D2 and distance D3 (in other words, D2+D3<D1). The distance D2 is a distance between the first outer connector 21 and the third side surface S3 in the width direction W (in other words, the minimum dimension in the width direction W of a portion that is one of a pair of two portions exposing the first side surface S1 near the third side surface S3). The distance D3 is a distance between the first outer connector 21 and the fourth side surface S4 in the width direction W (in other words, the minimum dimension in the width direction W of a portion that is one of the pair of two portions exposing the first side surface S1 near the fourth side surface S4).

As depicted in FIG. 14B, it is preferable that a centerline CL in the width direction W of the portion of the first outer connector 21, which covers the first side surface S1, is spaced away from a center position C of the first side surface S1. This is because, distortion that occurs at the multilayer ceramic capacitor 1A1 when voltage is applied becomes the largest at the center position C of the first side surface S1 and decreases as the position get closer to both end portions. In other words, by arranging in such a way that the centerline CL is separated from the center position C as described above, the vibration propagating to the wiring board becomes less. As a result, the occurrence of audible noise is significantly reduced or prevented.

Preferred Embodiment 2

Figure 15:
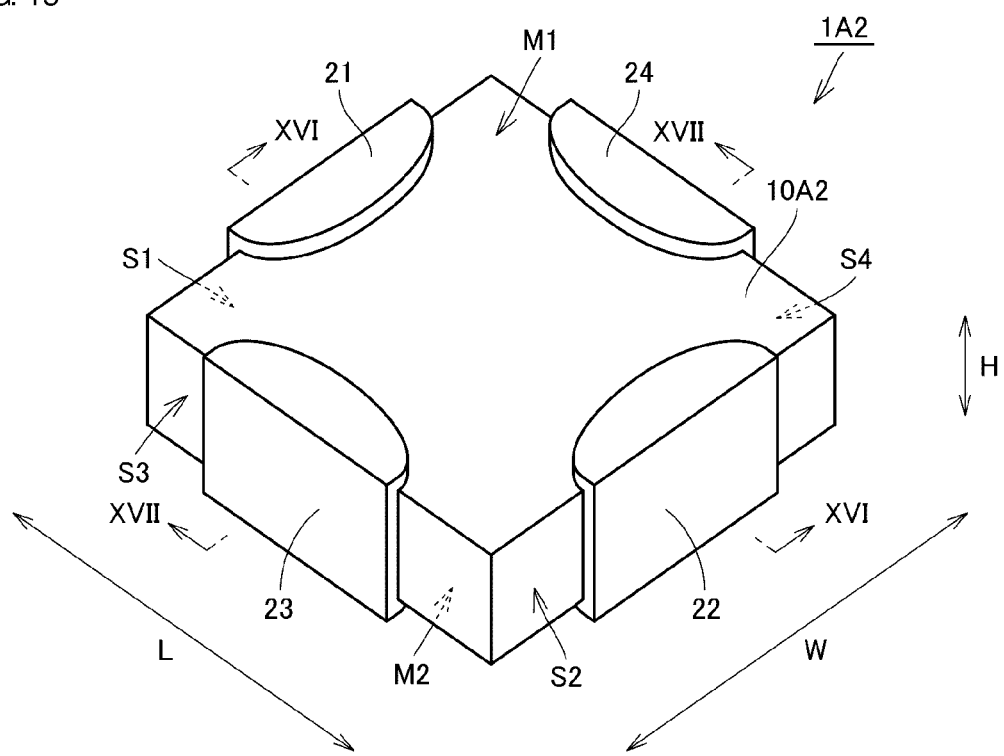
FIG. 15 is a perspective view depicting a multilayer ceramic capacitor according to Preferred Embodiment 2 of the present invention.
Figure 16:
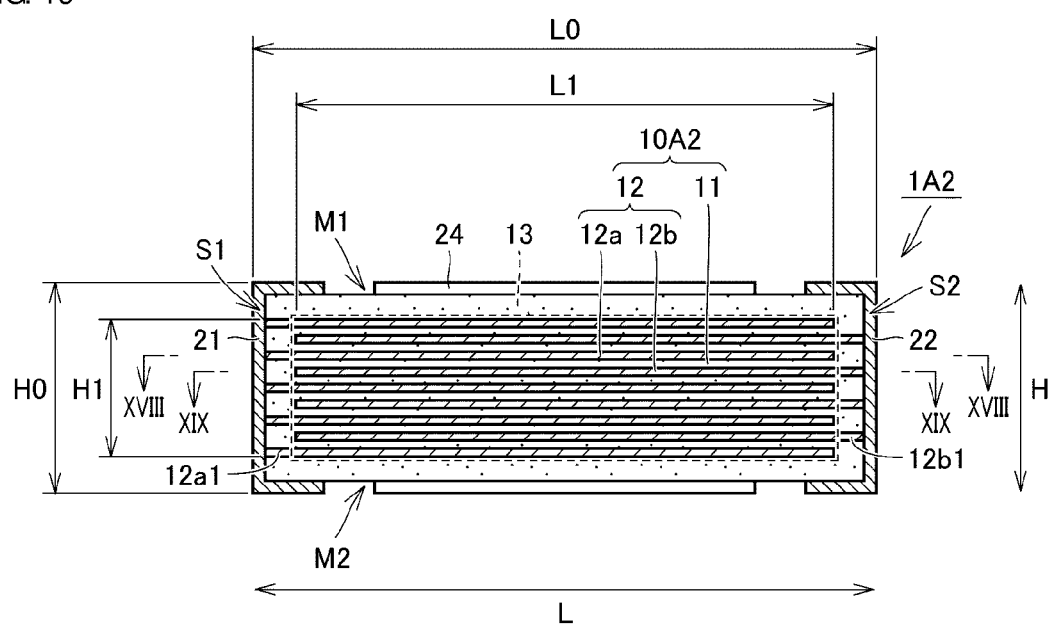
FIG. 16 is a cross-sectional view along line XVI-XVI illustrated in FIG. 15.
Figure 17:
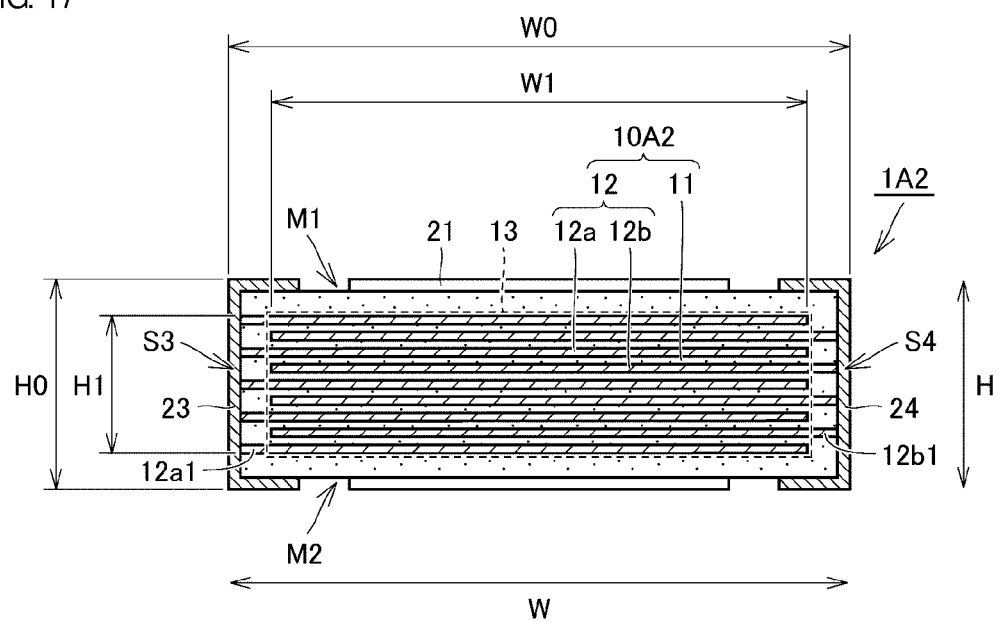
FIG. 17 is a cross-sectional view along line XVII-XVII illustrated in FIG. 15.
Figure 18:
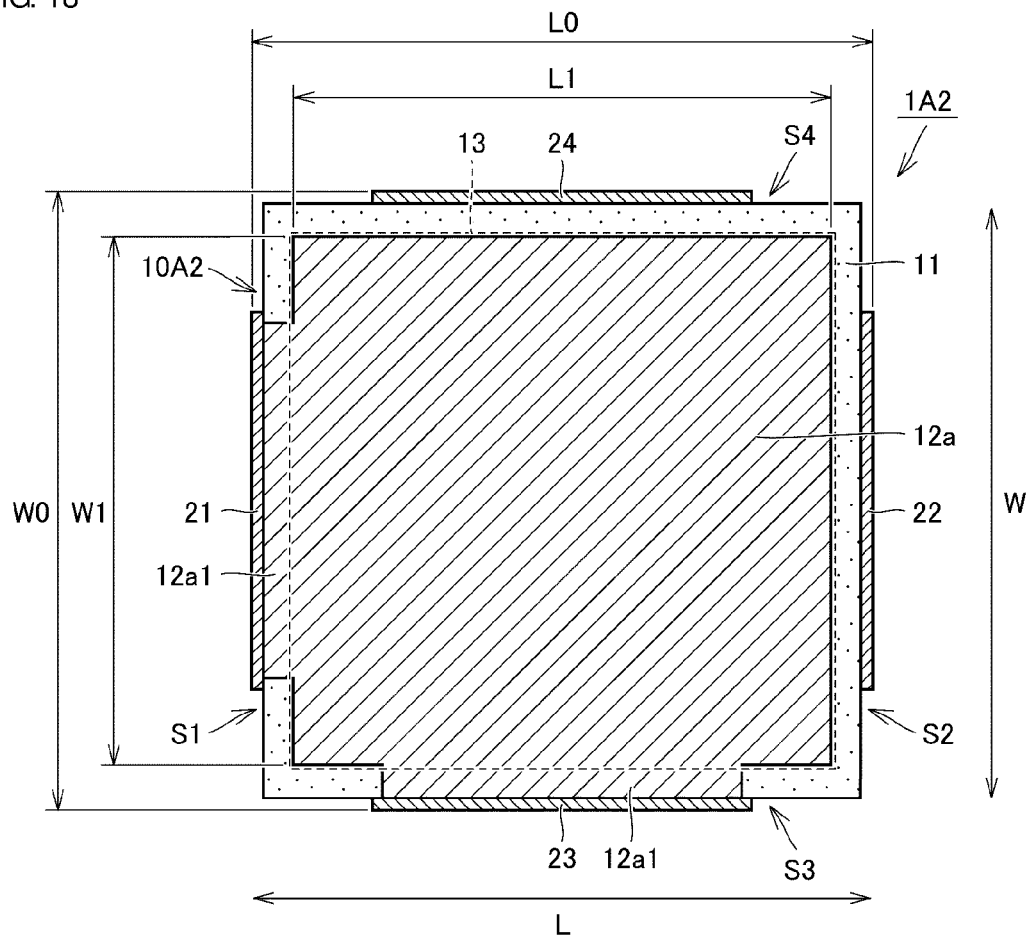
FIG. 18 is a cross-sectional view along line XVIII-XVIII illustrated in FIG. 16.
Figure 19:
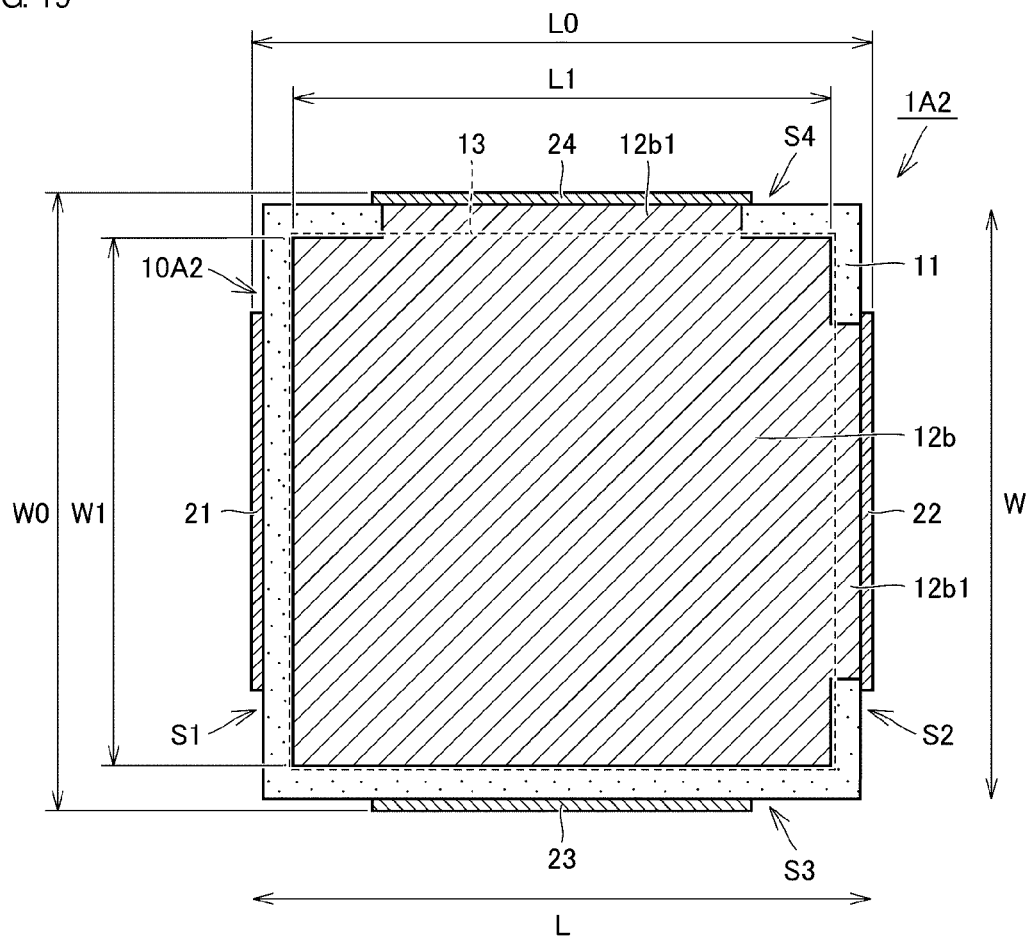
FIG. 19 is a cross-sectional view along line XIX-XIX illustrated in FIG. 16.

FIG. 15 is a perspective view depicting a multilayer ceramic capacitor according to Preferred Embodiment 2 of the present invention. FIG. 16 and FIG. 17 are cross-sectional views along line XVI-XVI and line XVII-XVII illustrated in FIG. 15, respectively. FIG. 18 and FIG. 19 are cross-sectional views along line XVIII-XVIII and line XIX-XIX illustrated in FIG. 16, respectively. Hereinafter, with reference to FIG. 15 to FIG. 19, a multilayer ceramic capacitor 1A2 according to the present preferred embodiment is described.

As depicted in FIG. 15 to FIG. 19, the multilayer ceramic capacitor 1A2 has an exterior structure similar to that of the multilayer ceramic capacitor 1A1 according to the Preferred Embodiment 1, and includes a thin, substantially cuboid capacitor body 10A2 and first to fourth outer connectors 21 to 24. The capacitor body 10A2 has first and second principal surfaces M1 and M2 as well as first to fourth side surfaces S1 to S4. The first to fourth outer connectors 21 to 24 are provided on outer surfaces of the capacitor body 10A2.

As depicted in FIG. 16 to FIG. 19, the capacitor body 10A2 includes a plurality of dielectric layers 11 and a plurality of substantially rectangular conductor layers 12, which are alternatingly stacked along the height direction H. As depicted in FIG. 18 and FIG. 19, the present preferred embodiment differs from the Preferred Embodiment 1 in that the plurality of conductor layers 12 includes a plurality of first conductor layers 12a and a plurality of second conductor layers 12b. The plurality of first conductor layers 12a is connected to the first outer connector 21 via an extended portion 12a1 extended to the first side surface S1 and also connected to the third outer connector 23 via an extended portion 12a1 extended to the third side surface S3. The plurality of second conductor layers 12b is connected to the second outer connector 22 via an extended portion 12b1 extended to the second side surface S2 and also connected to the fourth outer connector 24 via an extended portion 12b1 extended to the fourth side surface S4.

As depicted in FIG. 16 and FIG. 17, the first conductor layer 12a and second conductor layer 12b are arranged alternatingly along the height direction H. This defines an electrostatic capacitance portion, and by stacking a plurality of the electrostatic capacitance portions along the height direction H, an effective portion 13 is defined inside the capacitor body 10A2. The effective portion 13 has a thin, substantially cuboid shape.

Here, in the multilayer ceramic capacitor 1A2 according to the present preferred embodiment, the first to fourth outer connectors 21 to 24 define and function as so-called outer electrodes and are electrically and mechanically connected to a wiring board via a joining material such as solder and the like. On the other hand, the first conductor layer 12a and the second conductor layer 12b define and function as so-called internal electrode layers.

The multilayer ceramic capacitor 1A2 according to the present preferred embodiment is also a multilayer capacitor of a type that is typically referred to as a feed-through capacitor, and an equivalent circuit thereof is such as depicted in FIG. 6. However, in a case where the multilayer ceramic capacitor 1A2 is used as a decoupling capacitor to be installed in a DC/DC converter, the first outer connector 21 and the third outer connector 23 are electrically connected to a power line, and the second outer connector 22 and the fourth outer connector 24 are each electrically connected to ground (ground line).

Here, with reference to FIG. 16 to FIG. 19, also in the multilayer ceramic capacitor 1A2 according to the present preferred embodiment, various dimensions (in other words, the maximum external dimensions L0, W0, H0 and the dimensions L1, W1, and H1) are adjusted so as to satisfy all the first to sixth conditions. Accordingly, in the case where a configuration such as described in the present preferred embodiment is adopted, the occurrence of audible noise is significantly reduced or prevented without reducing flexibility in circuit board designing, as is the case where a configuration such as described in Preferred Embodiment 1 is adopted.

Preferred Embodiment 3

Figure 20:
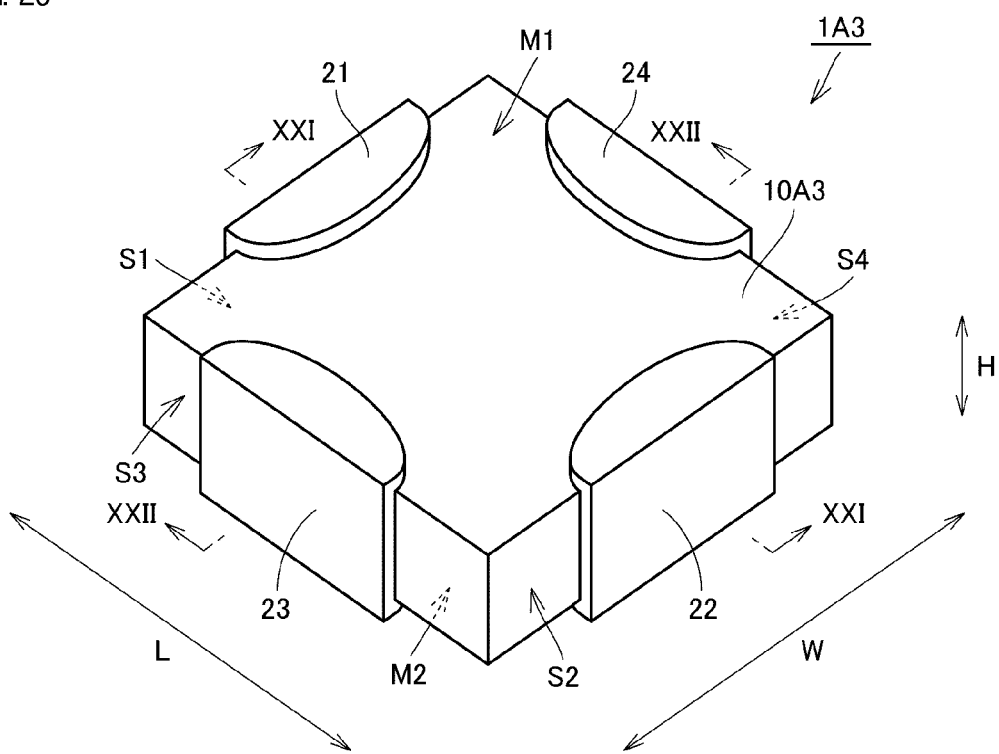
FIG. 20 is a perspective view depicting a multilayer ceramic capacitor according to Preferred Embodiment 3 of the present invention.
Figure 21:
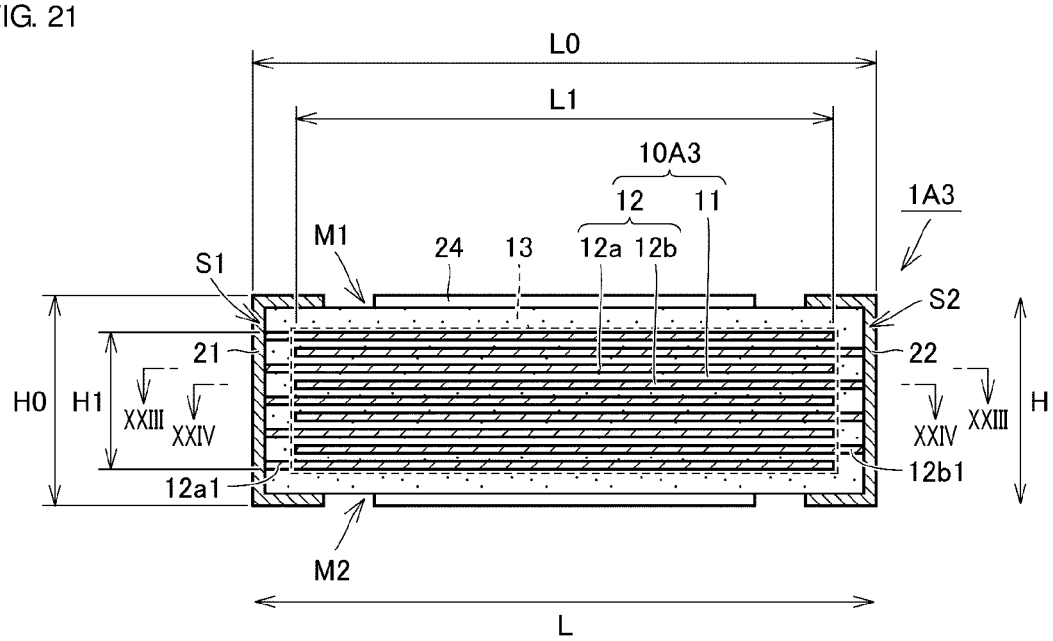
FIG. 21 is a cross-sectional view along line XXI-XXI illustrated in FIG. 20.
Figure 22:
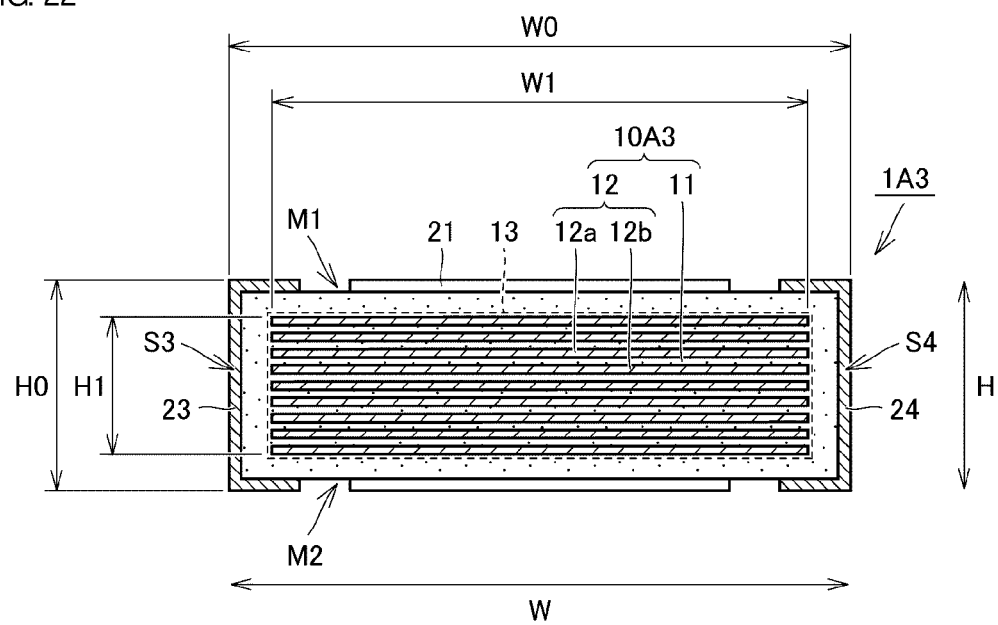
FIG. 22 is a cross-sectional view along line XXII-XXII illustrated in FIG. 20.
Figure 23:
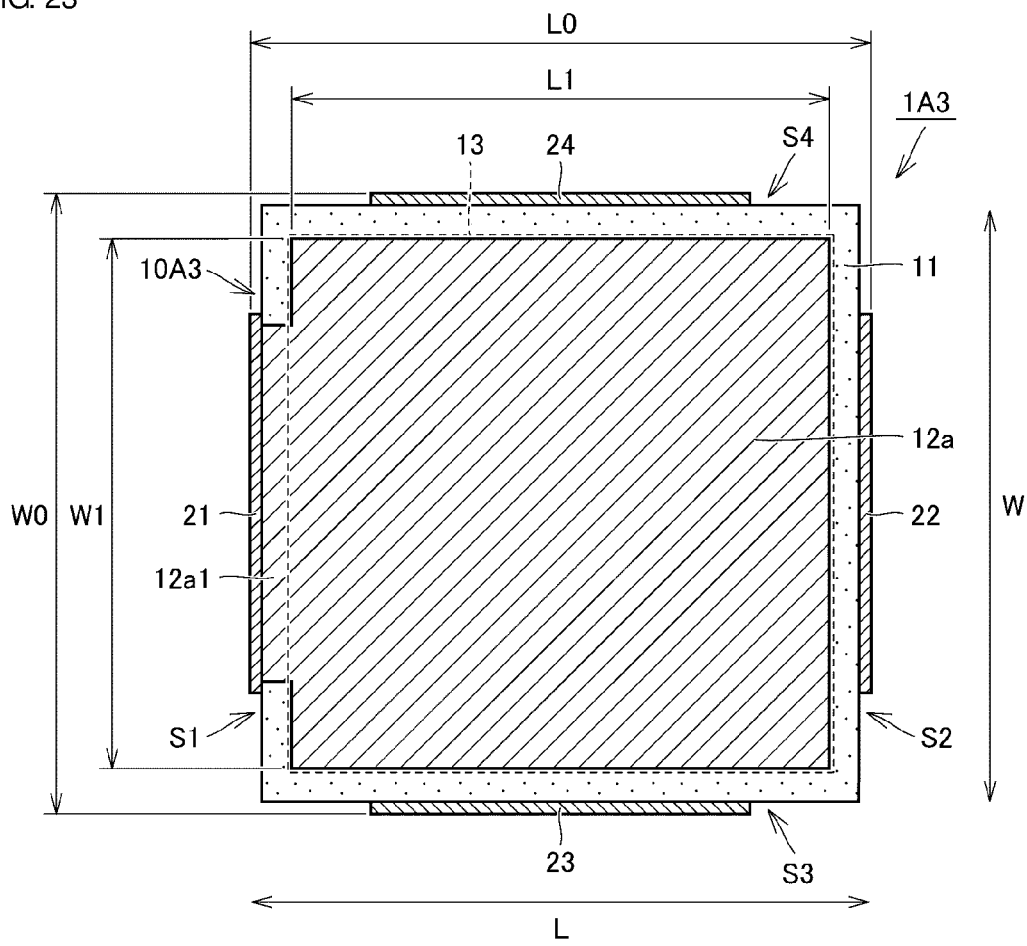
FIG. 23 is a cross-sectional view along line XXIII-XXIII illustrated in FIG. 21.
Figure 24:
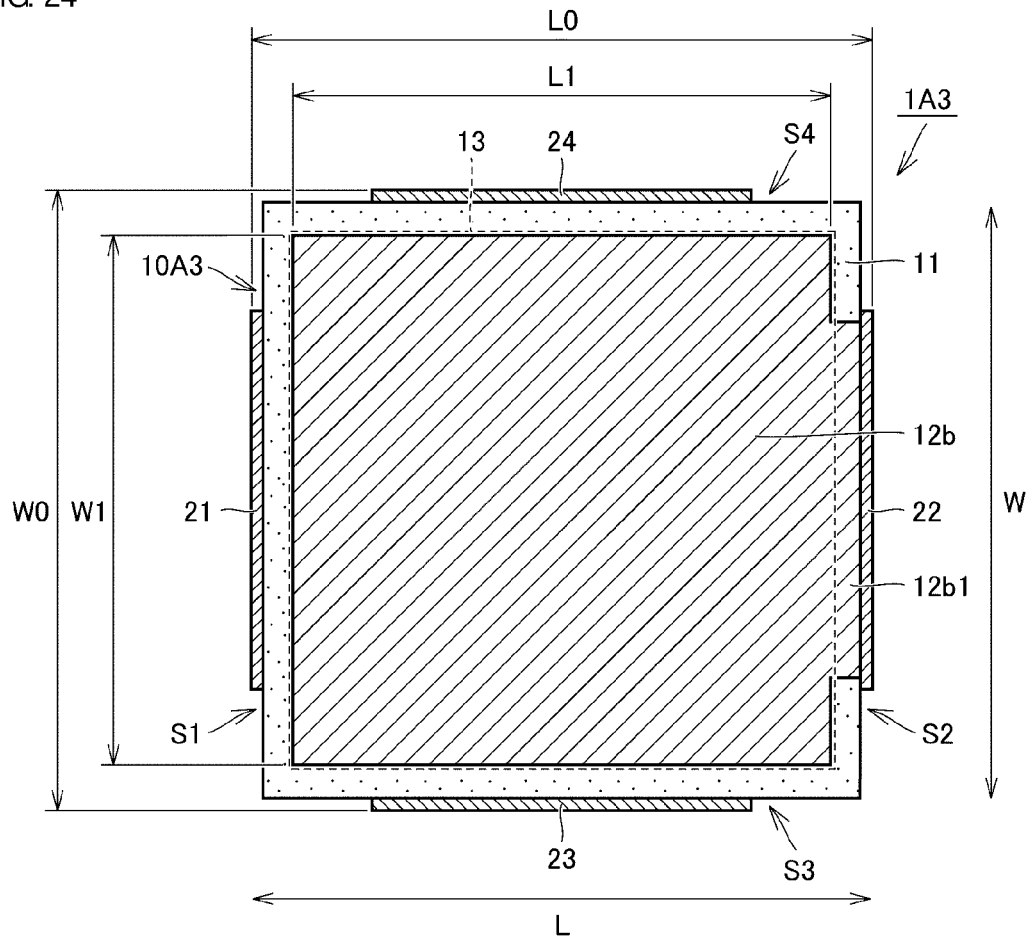
FIG. 24 is a cross-sectional view along line XXIV-XXIV illustrated in FIG. 21.
Figure 25:
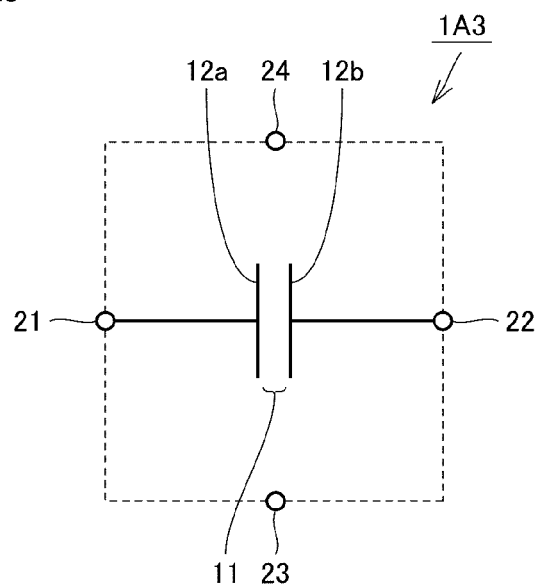
FIG. 25 is a diagram depicting an equivalent circuit of the multilayer ceramic capacitor depicted in FIG. 20.

FIG. 20 is a perspective view depicting a multilayer ceramic capacitor according to Preferred Embodiment 3 of the present invention. FIG. 21 and FIG. 22 are cross-sectional views along line XXI-XXI and line XXII-XXII illustrated in FIG. 20, respectively. FIG. 23 and FIG. 24 are cross-sectional views along line XXIII-XXIII and line XXIV-XXIV illustrated in FIG. 21, respectively. FIG. 25 is a diagram depicting an equivalent circuit of the multilayer ceramic capacitor depicted in FIG. 20. Hereinafter, with reference to FIG. 20 to FIG. 25, a multilayer ceramic capacitor 1A3 according to the present preferred embodiment is described.

As depicted in FIG. 20 to FIG. 24, the multilayer ceramic capacitor 1A3 has an exterior structure similar to that of the multilayer ceramic capacitor 1A1 according to the Preferred Embodiment 1, and includes a thin, substantially cuboid capacitor body 10A3 and first to fourth outer connectors 21 to 24. The capacitor body 10A3 includes first and second principal surfaces M1 and M2 as well as first to fourth side surfaces S1 to S4. The first to fourth outer connectors 21 to 24 are provided on outer surfaces of the capacitor body 10A3.

As depicted in FIG. 21 to FIG. 24, the capacitor body 10A3 includes a plurality of dielectric layers 11 and a plurality of substantially rectangular conductor layers 12, which are alternatingly stacked along the height direction H. As depicted in FIG. 23 and FIG. 24, the present preferred embodiment differs from the Preferred Embodiments 1 and 2 in that the plurality of conductor layers 12 includes a plurality of first conductor layers 12a and a plurality of second conductor layers 12b wherein the plurality of first conductor layers 12a is connected only to the first outer connector 21 via an extended portion 12a1 extended to the first side surface S1, and wherein the plurality of second conductor layers 12b is connected only to the second outer connector 22 via an extended portion 12b1 extended to the second side surface S2.

As depicted in FIG. 21 and FIG. 22, the first conductor layer 12a and the second conductor layer 12b are arranged alternatingly along the height direction H. This defines an electrostatic capacitance portion, and by stacking a plurality of the electrostatic capacitance portions along the height direction H, an effective portion 13 is defined inside the capacitor body 10A3. The effective portion 13 has a thin, substantially cuboid shape.

Here, in the multilayer ceramic capacitor 1A3 according to the present preferred embodiment, the first and second outer connectors 21 and 22 define and function as so-called outer electrodes, and are electrically and mechanically connected to a wiring board via a joining material such as solder and the like. Whereas, the third and fourth outer connectors 23 and 24 do not define and function as so-called outer electrodes, and are portions to be mechanically connected to the wiring board via a joining material such as solder and the like. On the other hand, the first conductor layer 12a and the second conductor layer 12b define and function as so-called internal electrode layers.

The multilayer ceramic capacitor 1A3 having the configuration is a multilayer capacitor of a type that is typically referred to as a two-terminal capacitor, and an equivalent circuit thereof is depicted in FIG. 25. In other words, the electrostatic capacitance portion that is defined by having the dielectric layer 11 between the first conductor layer 12a and the second conductor layer 12b is located between the first outer connector 21 and the second outer connector 22.

In a case where the multilayer ceramic capacitor 1A3 is used as a decoupling capacitor to be installed in a DC/DC converter, the first outer connector 21 is electrically connected to a power line, and the second outer connector 22 is electrically connected to ground (ground line).

Here, with reference to FIG. 21 to FIG. 24, also in the multilayer ceramic capacitor 1A3 according to the present preferred embodiment, various dimensions (in other words, the maximum external dimensions L0, W0, H0 and the dimensions L1, W1, and H1) are adjusted so as to satisfy all the first to sixth conditions. Accordingly, in the case where a configuration such as described in the present preferred embodiment is adopted, the occurrence of audible noise is significantly reduced or prevented without reducing flexibility in circuit board designing, as is the case where a configuration such as described in Preferred Embodiment 1 is adopted.

Preferred Embodiment 4

Figure 26:
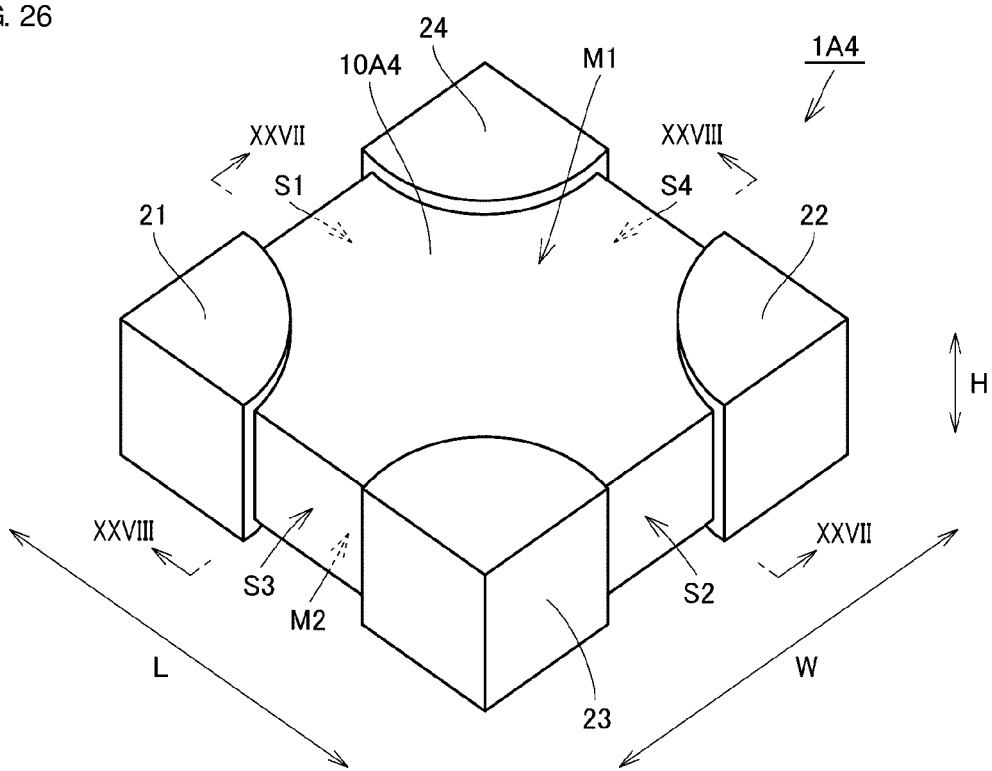
FIG. 26 is a perspective view depicting a multilayer ceramic capacitor according to Preferred Embodiment 4 of the present invention.
Figure 27:
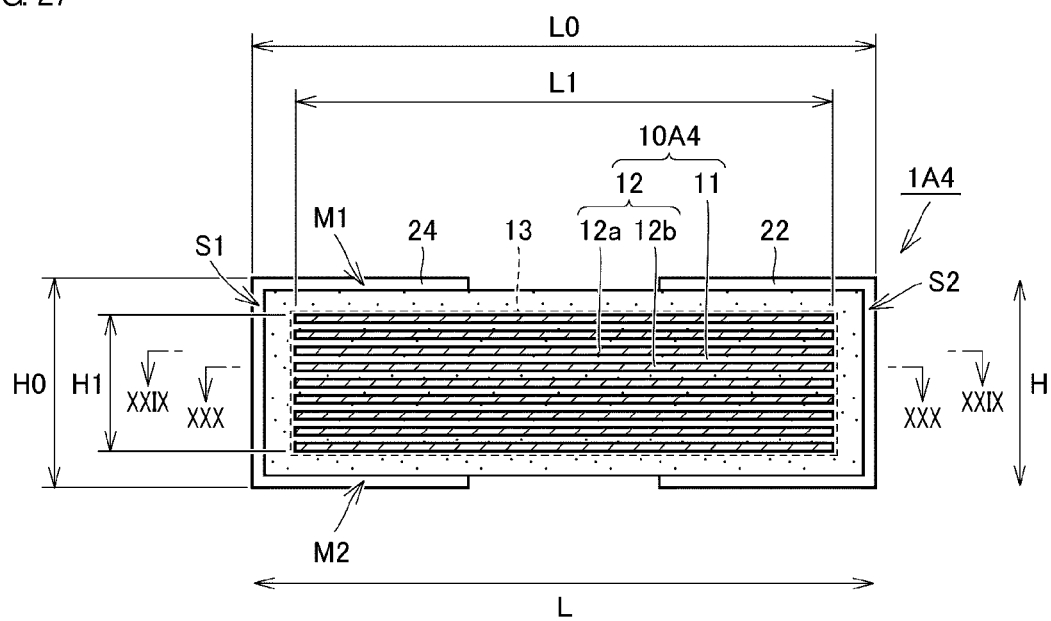
FIG. 27 is a cross-sectional view along line XXVII-XXVII illustrated in FIG. 26.
Figure 28:
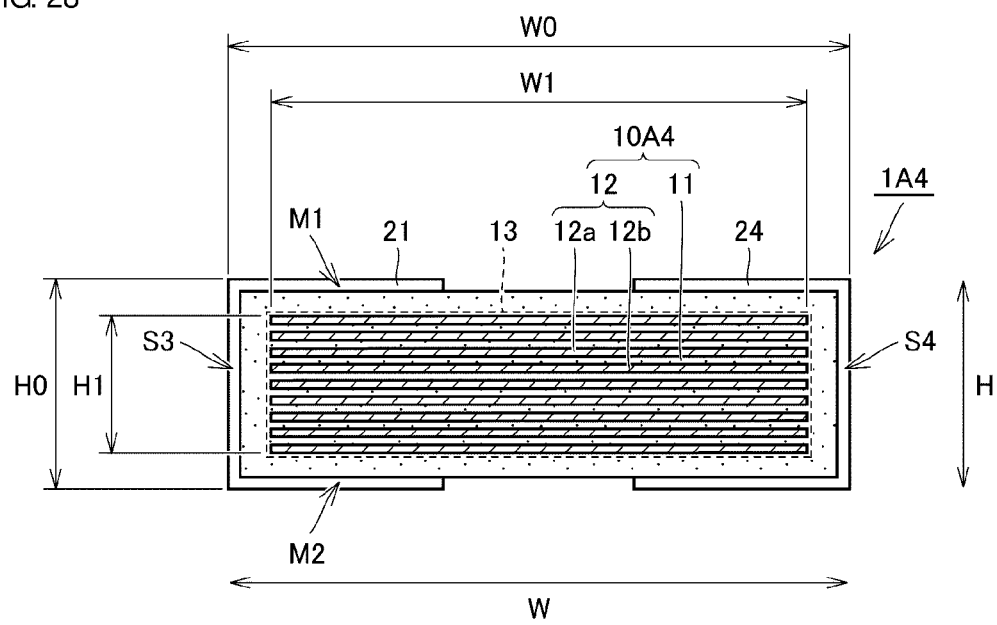
FIG. 28 is a cross-sectional view along line XXVIII-XXVIII illustrated in FIG. 26.
Figure 29:
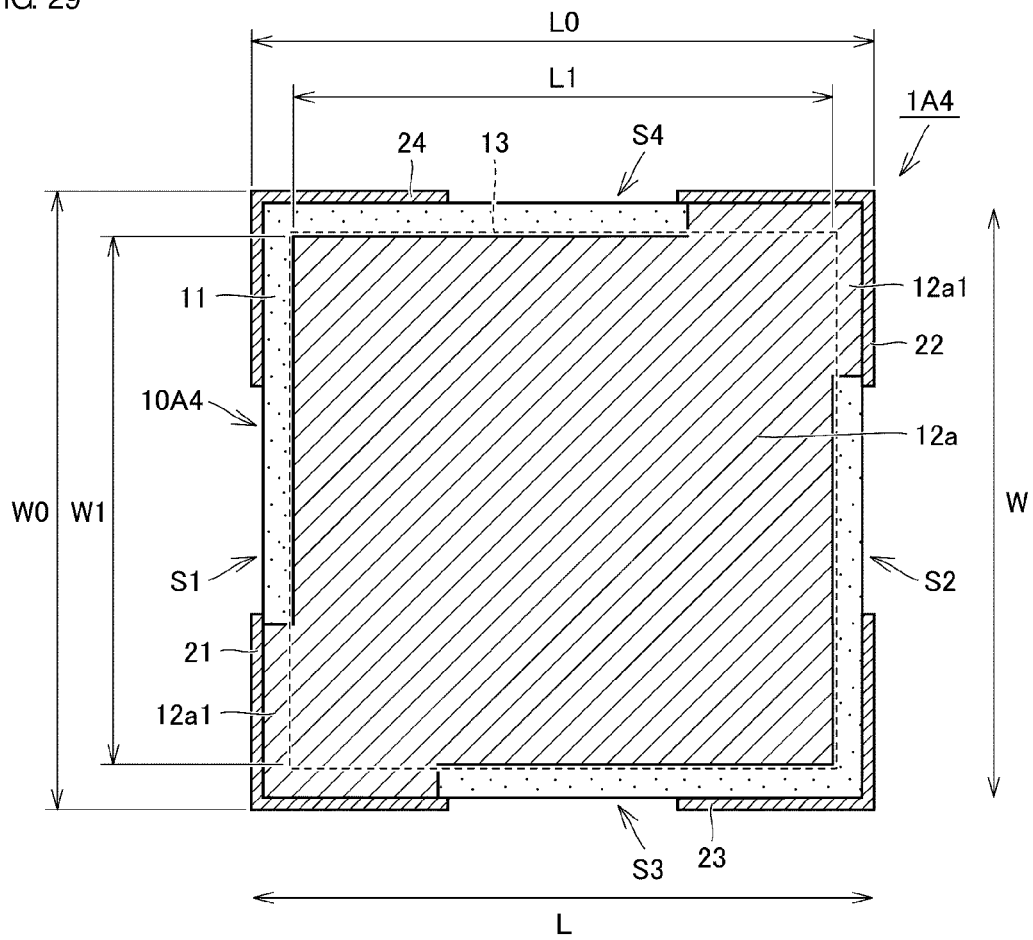
FIG. 29 is a cross-sectional view along line XXIX-XXIX illustrated in FIG. 27.
Figure 30:
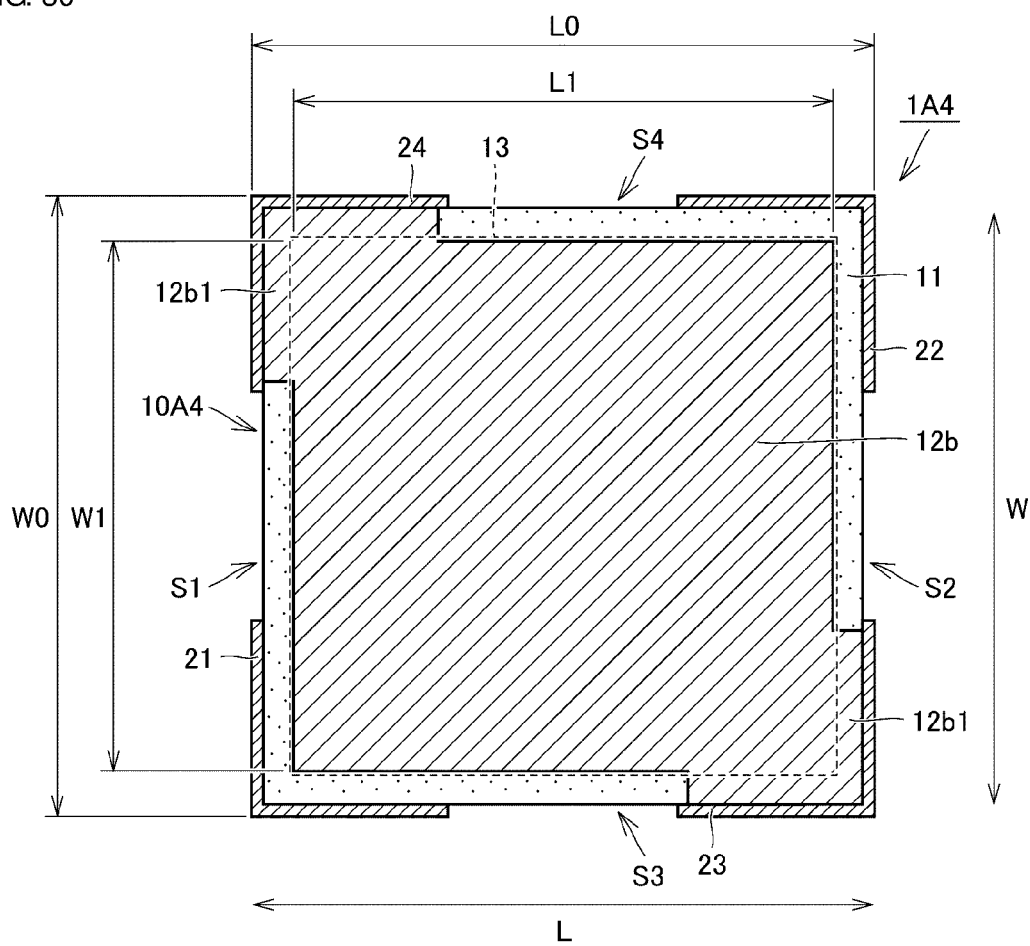
FIG. 30 is a cross-sectional view along line XXX-XXX illustrated in FIG. 27.

FIG. 26 is a perspective view depicting a multilayer ceramic capacitor according to Preferred Embodiment 4 of the present invention. FIG. 27 and FIG. 28 are cross-sectional views along line XXVII-XXVII and line XXVIII-XXVIII illustrated in FIG. 26, respectively. FIG. 29 and FIG. 30 are cross-sectional views along line XXIX-XXIX and line XXX-XXX illustrated in FIG. 27, respectively. Hereinafter, with reference to FIG. 26 to FIG. 30, a multilayer ceramic capacitor 1A4 according to the present preferred embodiment is described.

As depicted in FIG. 26 to FIG. 30, the multilayer ceramic capacitor 1A4 has a thin, substantially cuboid shape as a whole as with the multilayer ceramic capacitor 1A1 according to the Preferred Embodiment 1, and includes a thin, substantially cuboid capacitor body 10A4 and first to fourth outer connectors 21 to 24. The capacitor body 10A4 includes first and second principal surfaces M1 and M2 as well as first to fourth side surfaces S1 to S4. The first to fourth outer connectors 21 to 24 are provided on outer surfaces of the capacitor body 10A4. However, the present preferred embodiment differs from the Preferred Embodiment 1 in the position arrangement of the first to fourth outer connectors 21 to 24.

Specifically, the first outer connector 21 covers a portion of the first side surface S1 (a portion near the third side surface S3), further covers a portion of the third side surface S3 (a portion near the first side surface S1), and still further covers a portion of the first principal surface M1 and a portion of the second principal surface M2 in portions adjacent to a boundary portion of the first side surface S1 and the third side surface S3.

The second outer connector 22 covers a portion of the second side surface S2 (a portion near the fourth side surface S4), and covers a portion of the fourth side surface S4 (a portion near the second side surface S2), and further covers a portion of the first principal surface M1 and a portion of the second principal surface M2 in portions adjacent to a boundary portion of the second side surface S2 and the fourth side surface S4.

The third outer connector 23 covers a portion of the third side surface S3 (a portion near the second side surface S2), and covers a portion of the second side surface S2 (a portion near the third side surface S3), and further covers a portion of the first principal surface M1 and a portion of the second principal surface M2 in portions adjacent to a boundary portion of the third side surface S3 and the second side surface S2.

The fourth outer connector 24 covers a portion of the fourth side surface S4 (a portion near the first side surface S1), and covers a portion of the first side surface S1 (a portion near the fourth side surface S4), and further covers a portion of the first principal surface M1 and a portion of the second principal surface M2 in portions adjacent to a boundary portion of the fourth side surface S4 and the first side surface S1.

As depicted in FIG. 27 to FIG. 30, the capacitor body 10A4 includes a plurality of dielectric layers 11 and a plurality of substantially rectangular conductor layers 12, which are alternatingly stacked along the height direction H. The present preferred embodiment differs from the Preferred Embodiment 1 in shape of the plurality of conductor layers 12 in response to the difference from the Preferred Embodiment 1 in the position arrangement of the first to fourth outer connectors 21 to 24. Specifically, as depicted in FIG. 29 and FIG. 30, the plurality of conductor layers 12 includes a plurality of first conductor layers 12a and a plurality of second conductor layers 12b. The plurality of first conductor layers 12a is connected to the first outer connector 21 via an extended portion 12a1 extended to the first side surface S1 and the third side surface S3 and also connected to the second outer connector 22 via an extended portion 12a1 extended to the second side surface S2 and the fourth side surface S4. The plurality of second conductor layers 12b is connected to the third outer connector 23 via an extended portion 12b1 extended to the third side surface S3 and the second side surface S2 and also connected to the fourth outer connector 24 via an extended portion 12b1 extended to the fourth side surface S4 and the first side surface S1.

As depicted in FIG. 27 and FIG. 28, the first conductor layer 12a and the second conductor layer 12b are arranged alternatingly along the height direction H. This defines an electrostatic capacitance portion, and by stacking a plurality of the electrostatic capacitance portions along the height direction H, an effective portion 13 is defined inside the capacitor body 10A4. The effective portion 13 has a thin, substantially cuboid shape.

Here, in the multilayer ceramic capacitor 1A4 according to the present preferred embodiment, the first to fourth outer connectors 21 to 24 define and function as so-called outer electrodes and are electrically and mechanically connected to a wiring board via a joining material such as solder and the like. On the other hand, the first conductor layer 12a and the second conductor layer 12b define and function as so-called internal electrode layers.

The multilayer ceramic capacitor 1A4 according to the present preferred embodiment is also a multilayer capacitor of a type that is typically referred to as a feed-through capacitor, and an equivalent circuit thereof is such as depicted in FIG. 6.

Here, with reference to FIG. 27 to FIG. 30, also in the multilayer ceramic capacitor 1A4 according to the present preferred embodiment, various dimensions (in other words, the maximum external dimensions L0, W0, H0 and the dimensions L1, W1, and H1) are adjusted so as to satisfy all the first to sixth conditions. As is the case with the outer connectors in the Preferred Embodiment 1, the outer connectors in the present preferred embodiment are respectively provided on the first to fourth side surfaces. Accordingly, in the case where a configuration such as described in the present preferred embodiment is adopted, the occurrence of audible noise is significantly reduced or prevented without reducing flexibility in circuit board designing, as is the case where a configuration such as described in Preferred Embodiment 1 is adopted.

Figure 31:
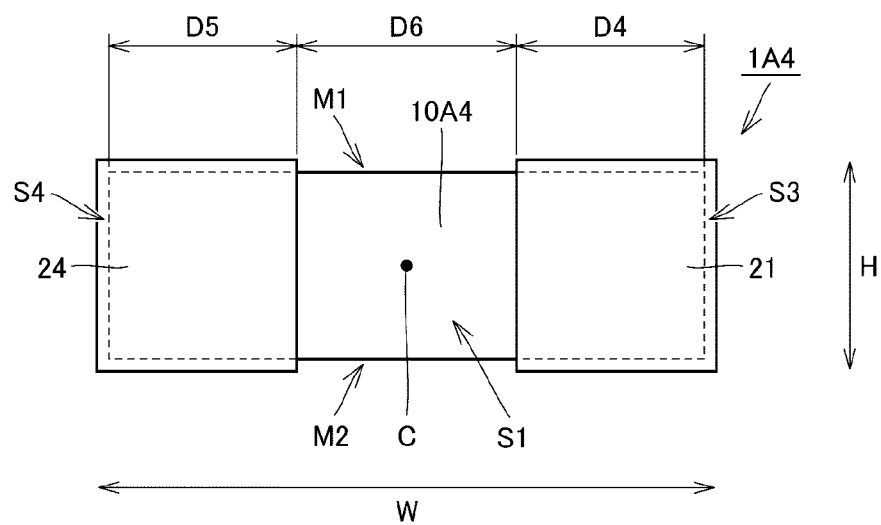
FIG. 31 is a side view for describing a preferred position arrangement of outer connectors in the multilayer ceramic capacitor depicted in FIG. 26.

FIG. 31 is a side view for describing a preferred position arrangement of outer connectors in the multilayer ceramic capacitor depicted in FIG. 26. Hereinafter, with reference to FIG. 31, the preferred position arrangement of outer connectors in the present preferred embodiment is described. FIG. 31 is a side view when the first side surface S1 is viewed from front. It is preferable that the second to fourth side surfaces S2 to S4 are also configured based on the configuration of the first side surface S1. All dimensions described below are, unless otherwise stated, the maximum dimensions of respective portions in the width direction W, and all distances described below are the minimum distances between portions in the width direction W.

With reference to FIG. 31, it is preferable that, in the multilayer ceramic capacitor 1A4 according to the present preferred embodiment, the center position C of the first side surface S1 is exposed. According to such configuration, of the first side surface S1, the center position C where the largest distortion occurs when voltage is applied to the multilayer ceramic capacitor 1A4 is not covered with the first and fourth outer connectors 21 and 24. This reduces vibration propagating to the wiring board, making it possible to significantly reduce or prevent the occurrence of audible noise.

Furthermore, in that case, it is preferable that dimension D4 and dimension D5 are made smaller, where the dimension D4 is the dimension of a portion of the first outer connector 21, which covers the first side surface S1, in the width direction W, and the dimension D5 is the dimension of a portion of the fourth outer connector 24, which covers the first side surface S1, in the width direction W. For example, the occurrence of audible noise is able to effectively reduced or prevented by making each one of the dimensions D4 and D5 smaller than distance D6 (in other words, D4<D6 and D5<D6) where the distance D6 is the distance between the first outer connector 21 and the fourth outer connector 24 in the width direction W (in other words, the minimum dimension of a portion at which the first side surface S1 is exposed in the width direction W).

However, from the viewpoint of that the distortion is significantly reduced or prevented by restraining the capacitor body 10A4 with the first and fourth outer connectors 21 and 24, it is preferable that both the dimension D4 and the dimension D5 are made larger. Thus, the occurrence of audible noise may be more effectively reduced or prevented by making the total dimension of the dimensions D4 and D5 larger than the distance D6 (in other words, D6<D4+D5) while satisfying the conditions described above.

Although details are not provided herein, in a multilayer ceramic capacitor including first to fourth outer connectors, such as the multilayer ceramic capacitor 1A4 according to the present preferred embodiment, relations of connection between the first to fourth outer connectors and the first conductor layer 12a and second conductor layer 12b may be changed in a variety of ways. In that case, while having an exterior structure such as that of the multilayer ceramic capacitor 1A4 according to the present preferred embodiment, a feed-through type multilayer capacitor having relations of connection between the outer connectors and the conductor layers, such as the Preferred Embodiment 2, a two-terminal type multilayer capacitor having relations of connection between the outer connectors and the conductor layers, such as the Preferred Embodiment 3, and the like may be provided.

Preferred Embodiment 5

Figure 32:
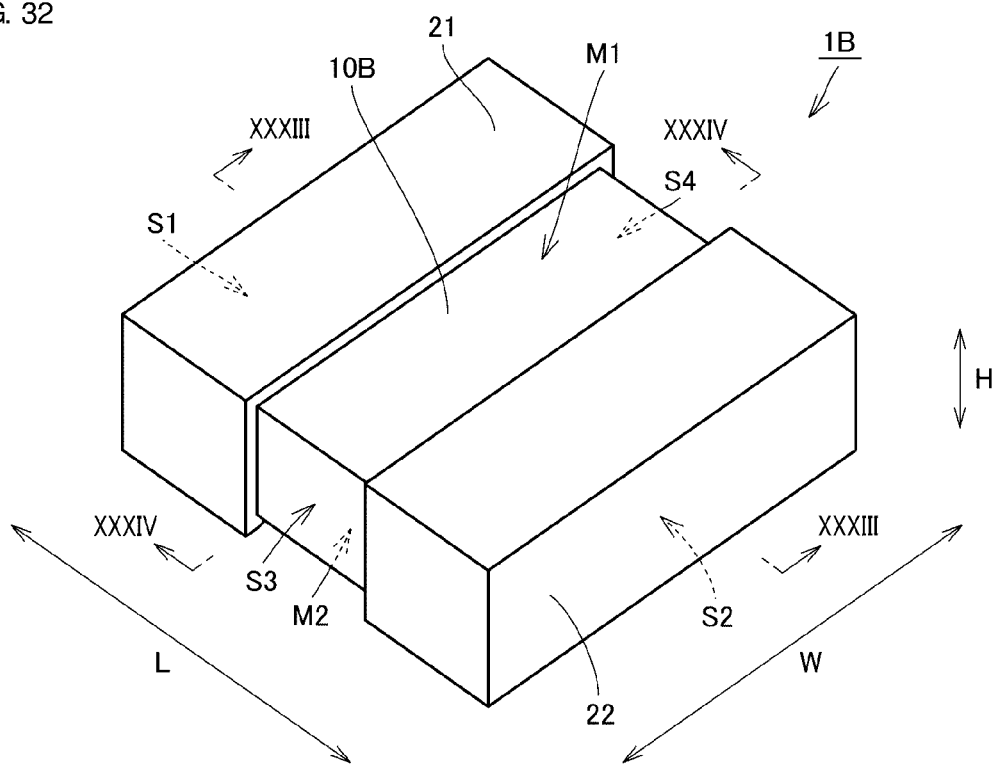
FIG. 32 is a perspective view depicting a multilayer ceramic capacitor according to Preferred Embodiment 5 of the present invention.
Figure 33:
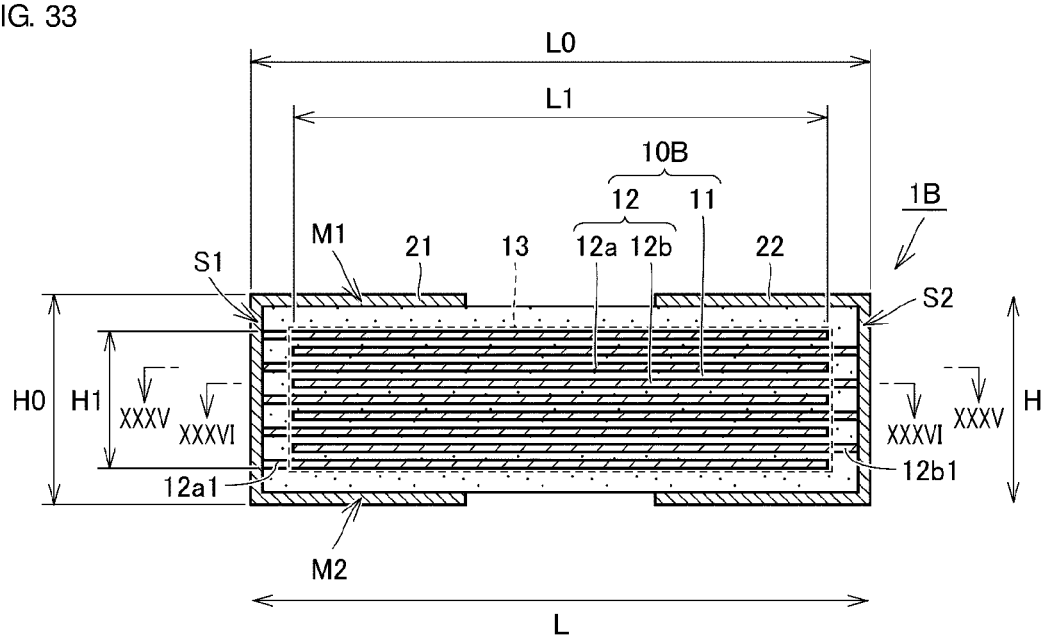
FIG. 33 is a cross-sectional view along line XXXIII-XXXIII illustrated in FIG. 32.
Figure 34:
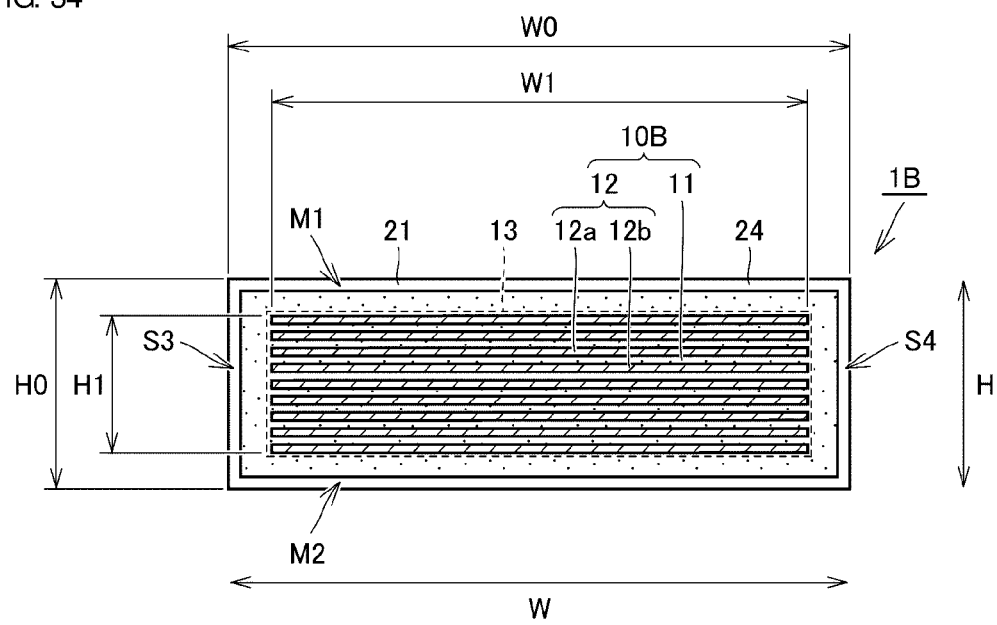
FIG. 34 is a cross-sectional view along line XXXIV-XXXIV illustrated in FIG. 32.
Figure 35:
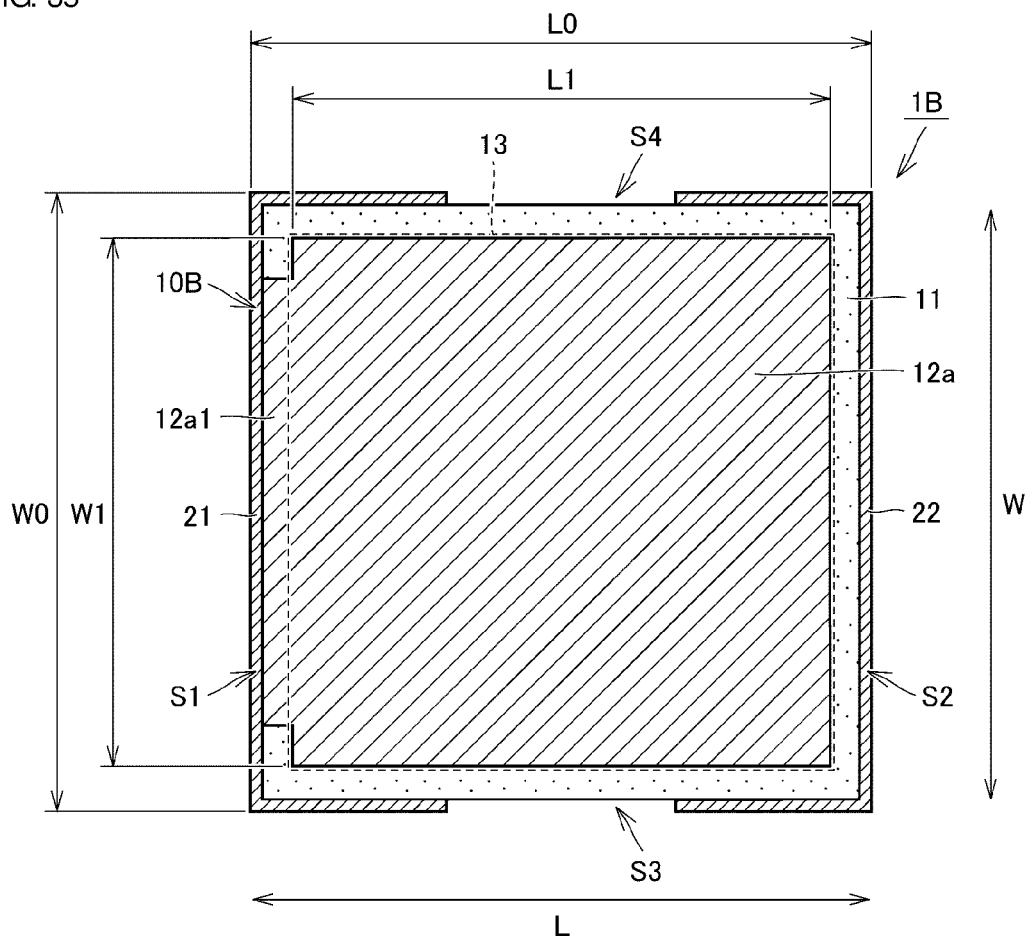
FIG. 35 is a cross-sectional view along line XXXV-XXXV illustrated in FIG. 33.
Figure 36:
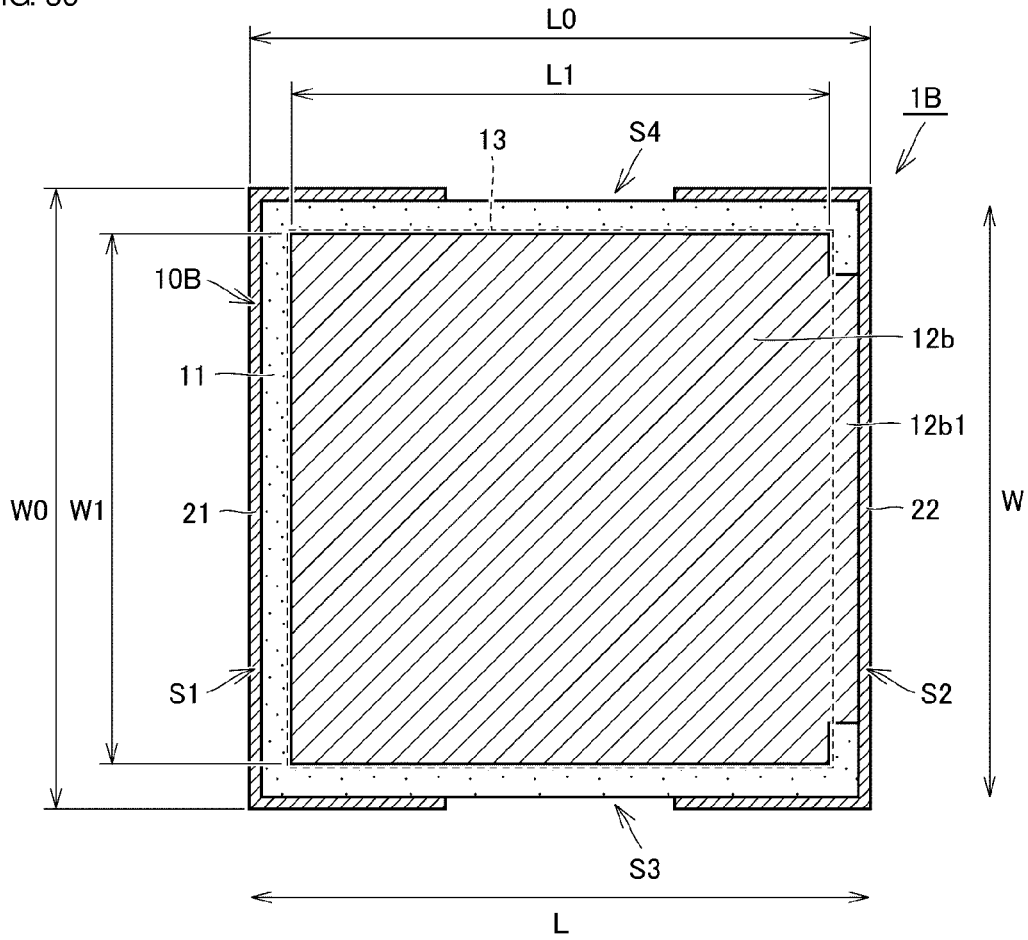
FIG. 36 is a cross-sectional view along line XXXVI-XXXVI illustrated in FIG. 33.

FIG. 32 is a perspective view depicting a multilayer ceramic capacitor according to Preferred Embodiment 5 of the present invention. FIG. 33 and FIG. 34 are cross-sectional views along line XXXIII-XXXIII and line XXXIV-XXXIV illustrated in FIG. 32, respectively. FIG. 35 and FIG. 36 are cross-sectional views along line XXXV-XXXV and line XXXVI-XXXVI illustrated in FIG. 33, respectively. Hereinafter, with reference to FIG. 32 to FIG. 36, a multilayer ceramic capacitor 1B according to the present preferred embodiment is described.

As depicted in FIG. 32 to FIG. 36, the multilayer ceramic capacitor 1B has a thin, substantially cuboid shape as a whole as with the multilayer ceramic capacitor 1A1 according to the Preferred Embodiment 1, and includes a thin, substantially cuboid capacitor body 10B and first and second outer connectors 21 and 22. The capacitor body 10B includes first and second principal surfaces M1 and M2 as well as first to fourth side surfaces S1 to S4. The first and second outer connectors 21 and 22 are provided on outer surfaces of the capacitor body 10B. Here, the present preferred embodiment differs from the Preferred Embodiment 1 in that the multilayer ceramic capacitor 1B includes only two outer connectors, the first and second outer connectors 21 and 22.

The first outer connector 21 covers the entire a portion of the first side surface S1, further covers a portion of the third side surface S3 (a portion near the first side surface S1) and a portion of the fourth side surface S4 (a portion near the first side surface S1), and still further covers a portion of the first principal surface M1 and a portion of the second principal surface M2 in portions adjacent to the first side surface S1.

The second outer connector 22 covers the entire a portion of the second side surface S2, further covers a portion of the third side surface S3 (a portion near the second side surface S2) and a portion of the fourth side surface S4 (a portion near the second side surface S2), and still further covers a portion of the first principal surface M1 and a portion of the second principal surface M2 in portions adjacent to the second side surface S2.

As depicted in FIG. 33 to FIG. 36, the capacitor body 10B includes a plurality of dielectric layers 11 and a plurality of substantially rectangular conductor layers 12, which are alternatingly stacked along the height direction H. As depicted in FIG. 35 and FIG. 36, the plurality of conductor layers 12 includes a plurality of first conductor layers 12a connected to the first outer connector 21 via an extended portion 12a1 extended to the first side surface S1 and a plurality of second conductor layers 12b connected to the second outer connector 22 via an extended portion 12b1 extended to the second side surface S2.

As depicted in FIG. 33 and FIG. 34, the first conductor layer 12a and the second conductor layer 12b are arranged alternatingly along the height direction H. This defines an electrostatic capacitance portion, and by stacking a plurality of the electrostatic capacitance portions along the height direction H, an effective portion 13 is defined inside the capacitor body 10B. The effective portion 13 has a thin, substantially cuboid shape.

Here, in the multilayer ceramic capacitor 1B according to the present preferred embodiment, the first and second outer connectors 21 and 22 define and function as so-called outer electrodes and are electrically and mechanically connected to a wiring board via a joining material such as solder and the like. On the other hand, the first conductor layer 12a and the second conductor layer 12b define and function as so-called internal electrode layers.

The multilayer ceramic capacitor 1B according to the present preferred embodiment is a multilayer capacitor of a type that is typically referred to as a two-terminal capacitor, and an equivalent circuit thereof is such as depicted in FIG. 25.

Here, with reference to FIG. 33 to FIG. 36, also in the multilayer ceramic capacitor 1B according to the present preferred embodiment, various dimensions (in other words, the maximum external dimensions L0, W0, H0 and the dimensions L1, W1, and H1) are adjusted so as to satisfy all the first to sixth conditions. As is the case with the outer connectors in the Preferred Embodiment 1, the outer connectors in the present preferred embodiment are provided on the first to fourth side surfaces. Accordingly, in the case where a configuration such as described in the present preferred embodiment is adopted, the occurrence of audible noise is significantly reduced or prevented without reducing flexibility in circuit board designing, as is the case where a configuration such as described in Preferred Embodiment 1 is adopted.

Figure 37:
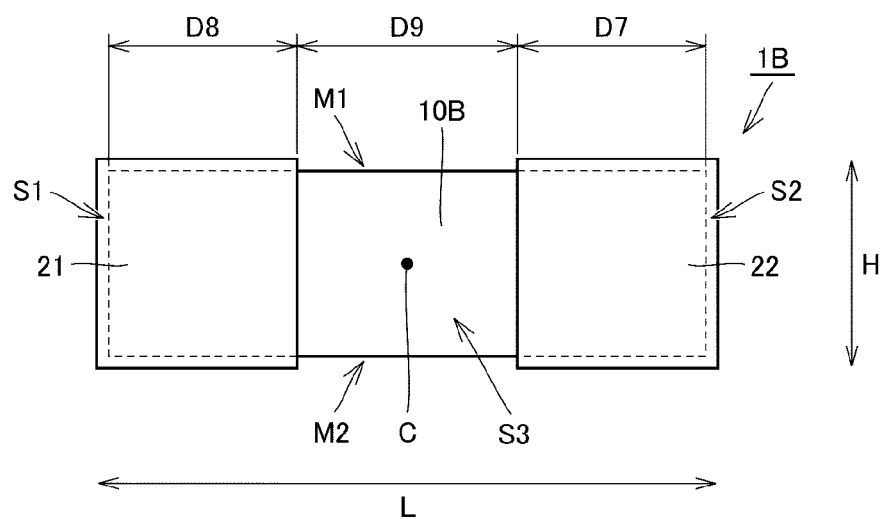
FIG. 37 is a side view for describing a preferred position arrangement of outer connectors in the multilayer ceramic capacitor depicted in FIG. 32.

FIG. 37 is a side view for describing a preferred position arrangement of outer connectors in the multilayer ceramic capacitor depicted in FIG. 32. Hereinafter, with reference to FIG. 37, the preferred position arrangement of outer connectors in the present preferred embodiment is described. FIG. 37 is a side view when the third side surface S3 is viewed from front. It is preferable that the fourth side surface S4 is also configured based on the configuration of the third side surface S3. All dimensions described below are, unless otherwise stated, the maximum dimensions of respective portions in the length direction L, and all distances described below are the minimum distances between portions in the length direction L.

With reference to FIG. 37, it is preferable that, in the multilayer ceramic capacitor 1B according to the present preferred embodiment, the center position C of the third side surface S3 is exposed. According to such configuration, of the third side surface S3, the center position C where the largest distortion occurs when voltage is applied to the multilayer ceramic capacitor 1B is not covered with the first and second outer connectors 21 and 22. This reduces vibration propagating to the wiring board, making it possible to significantly reduce or prevent the occurrence of audible noise.

Furthermore, in that case, it is preferable that dimension D7 and dimension D8 are made smaller, where the dimension D7 is the dimension of a portion of the first outer connector 21, which covers the third side surface S3, in the length direction L, and the dimension D8 is the dimension of a portion of the second outer connector 22, which covers the third side surface S3, in the length direction L. For example, the occurrence of audible noise may be effectively reduced or prevented by making each one of the dimensions D7 and D8 smaller than distance D9 (in other words, D7<D9 and D8<D9), where the distance D9 is the distance between the first outer connector 21 and the second outer connector 22 in the length direction L (in other words, the minimum dimension of a portion at which the third side surface S3 is exposed in the length direction L).

However, from the viewpoint of that the distortion is significantly reduced or prevented by restraining the capacitor body 10B with the first and second outer connectors 21 and 22, it is preferable that both the dimension D7 and the dimension D8 are made larger. Thus, the occurrence of audible noise is more effectively reduced or prevented by making the total dimension of the dimensions D7 and D8 larger than the distance D9 (in other words, D9<D7+D8) while satisfying the conditions described above.

Preferred Embodiment 6

Figure 38:
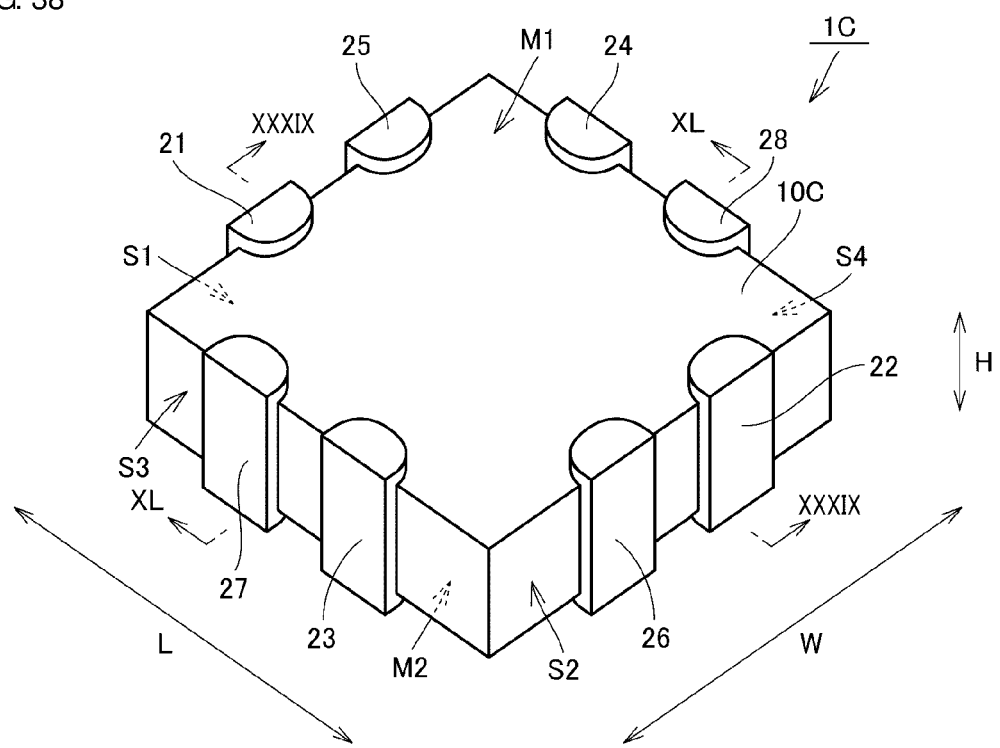
FIG. 38 is a perspective view depicting a multilayer ceramic capacitor array according to Preferred Embodiment 6 of the present invention.
Figure 39:
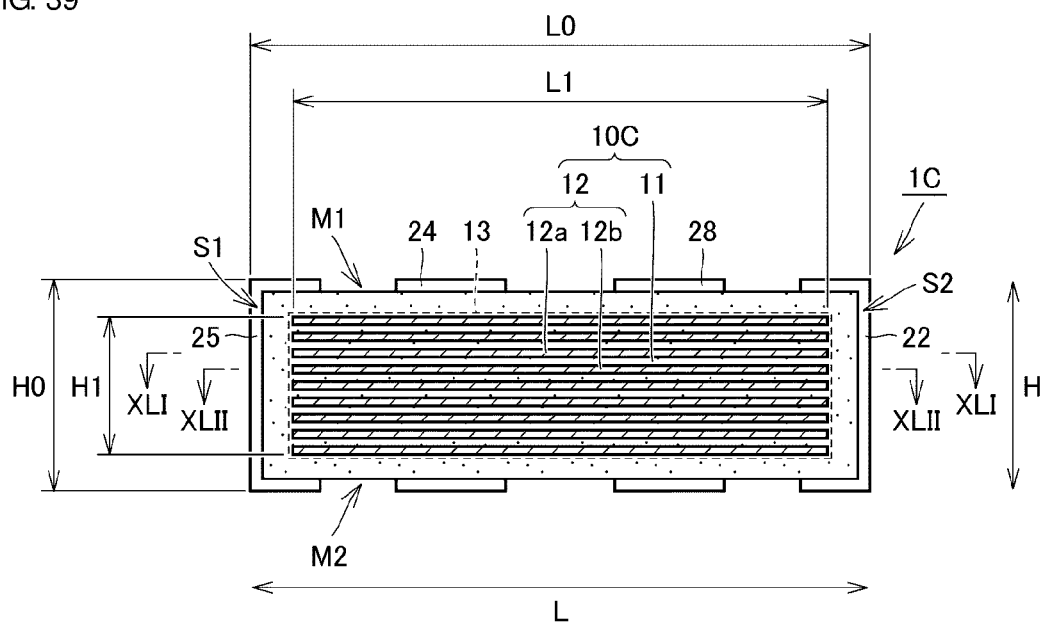
FIG. 39 is a cross-sectional view along line XXXIX-XXXIX illustrated in FIG. 38.
Figure 40:
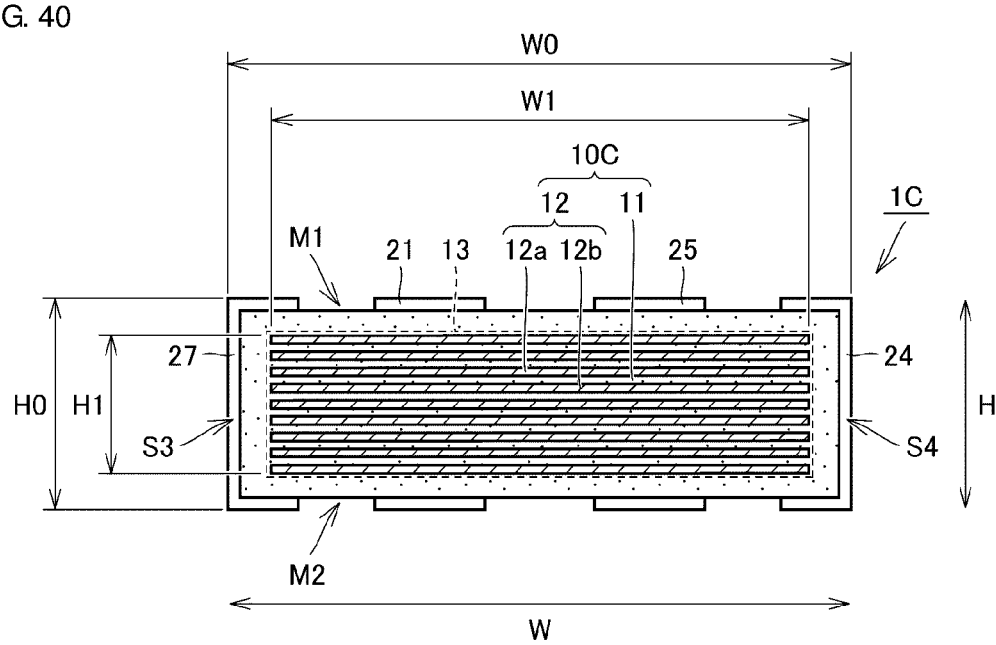
FIG. 40 is a cross-sectional view along line XL-XL illustrated in FIG. 38.
Figure 41:
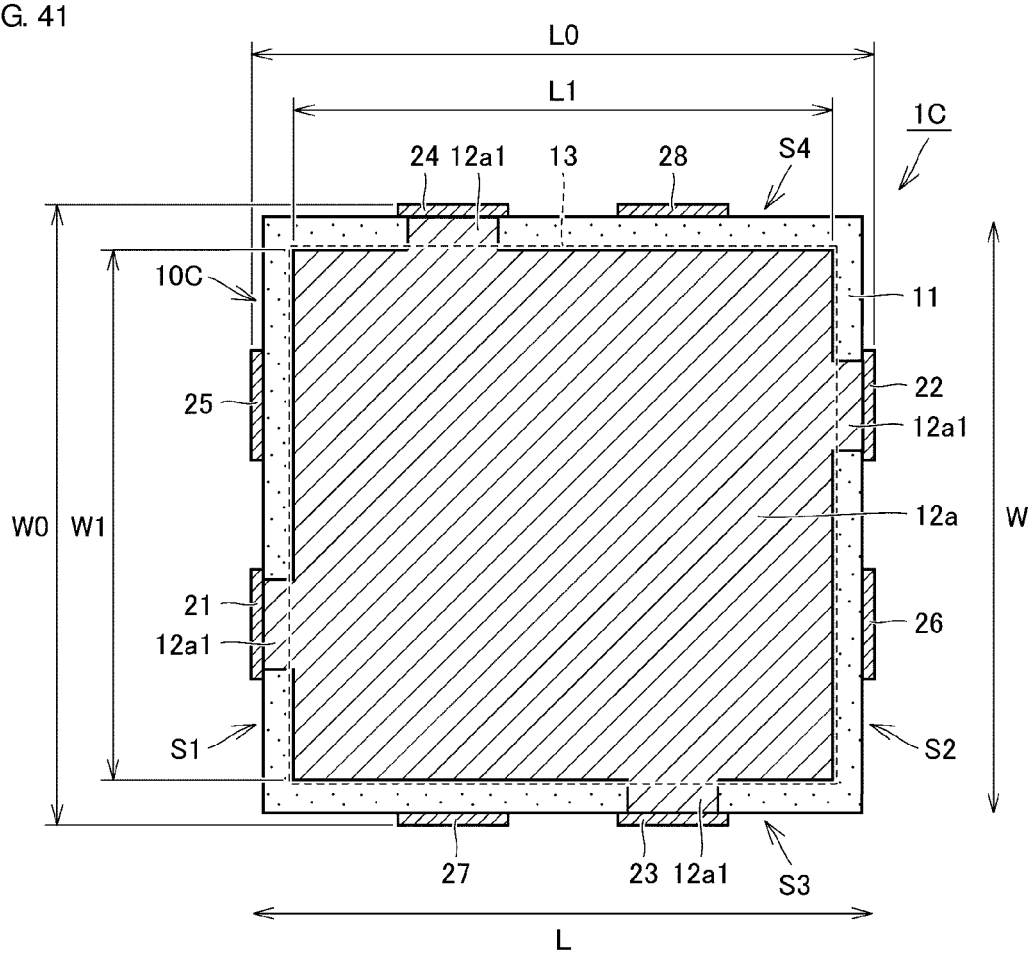
FIG. 41 is a cross-sectional view along line XLI-XLI illustrated in FIG. 39.
Figure 42:
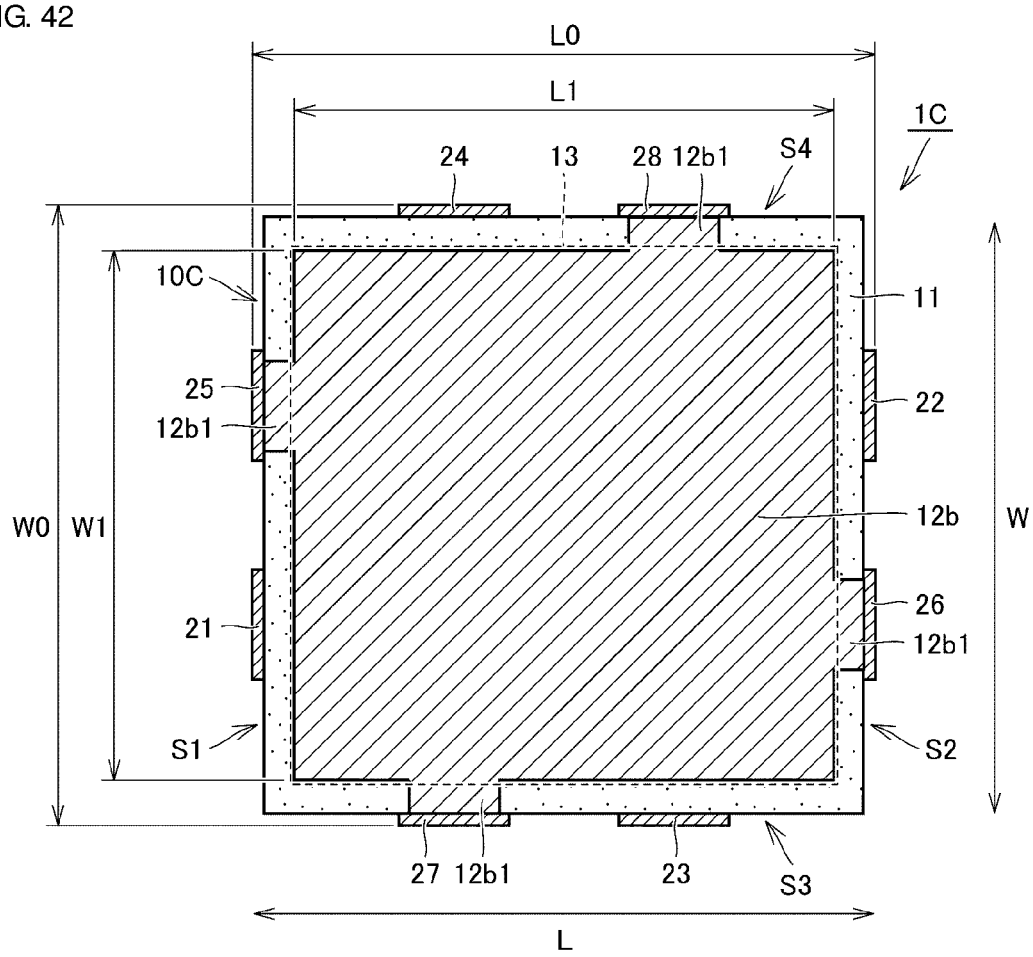
FIG. 42 is a cross-sectional view along line XLII-XLII illustrated in FIG. 39.

FIG. 38 is a perspective view depicting a multilayer ceramic capacitor according to Preferred Embodiment 6 of the present invention. FIG. 39 and FIG. 40 are cross-sectional views along line XXXIX-XXXIX and line XL-XL illustrated in FIG. 38, respectively. FIG. 41 and FIG. 42 are cross-sectional views along line XLI-XLI and line XLII-XLII illustrated in FIG. 39, respectively. Hereinafter, with reference to FIG. 38 to FIG. 42, a multilayer ceramic capacitor 1C according to the present preferred embodiment is described.

As depicted in FIG. 38 to FIG. 42, the multilayer ceramic capacitor 1C has a thin, substantially cuboid shape as a whole as with the multilayer ceramic capacitor 1A1 according to the Preferred Embodiment 1, and includes a thin, substantially cuboid capacitor body 10C and first to eighth outer connectors 21 to 28. The capacitor body 10C has first and second principal surfaces M1 and M2 as well as first to fourth side surfaces S1 to S4. The first to eighth outer connectors 21 to 28 are provided on outer surfaces of the capacitor body 10C. Here, the present preferred embodiment differs from the Preferred Embodiment 1 in that the multilayer ceramic capacitor 1C includes eight outer connectors, the first to eighth outer connectors 21 to 28.

The first and fifth outer connectors 21 and 25 each cover a portion of the first side surface S1 (near locations that substantially trisect the first side surface S1 in the width direction W), and further cover a portion of the first principal surface M1 and a portion of the second principal surface M2 in portions adjacent to the locations that substantially trisect the first side surface S1.

The second and sixth outer connectors 22 and 26 each cover a portion of the second side surface S2 (near locations that substantially trisect the second side surface S2 in the width direction W), and further cover a portion of the first principal surface M1 and a portion of the second principal surface M2 in portions adjacent to the locations that substantially trisect the second side surface S2.

The third and seventh outer connectors 23 and 27 each cover a portion of the third side surface S3 (near locations that substantially trisect the third side surface S3 in the length direction L), and further cover a portion of the first principal surface M1 and a portion of the second principal surface M2 in portions adjacent to the locations that substantially trisect the third side surface S3.

The fourth and eighth outer connectors 24 and 28 each cover a portion of the fourth side surface S4 (near locations that substantially trisect the fourth side surface S4 in the length direction L), and further cover a portion of the first principal surface M1 and a portion of the second principal surface M2 in portions adjacent to the locations that substantially trisect the fourth side surface S4.

As depicted in FIG. 39 to FIG. 42, the capacitor body 10C includes a plurality of dielectric layers 11 and a plurality of substantially rectangular conductor layers 12, which are alternatingly stacked along the height direction H. As depicted in FIG. 41 and FIG. 42, the plurality of conductor layers 12 includes a plurality of first conductor layers 12a and a plurality of second conductor layers 12b. The plurality of first conductor layers 12a is connected to the first to fourth outer connectors 21 to 24 via extended portions 12a1 extended to the first to fourth side surfaces S1 to S4, respectively. The plurality of second conductor layers 12b is connected to the fifth to eighth outer connectors 25 to 28 via extended portions 12b1 extended to the first to fourth side surfaces S1 to S4, respectively.

As depicted in FIG. 39 and FIG. 40, the first conductor layer 12a and the second conductor layer 12b are arranged alternatingly along the height direction H. This defines an electrostatic capacitance portion, and by stacking a plurality of the electrostatic capacitance portions along the height direction H, an effective portion 13 is defined inside the capacitor body 10C. The effective portion 13 has a thin, substantially cuboid shape.

Here, in the multilayer ceramic capacitor 1C according to the present preferred embodiment, the first to eighth outer connectors 21 to 28 define and function as so-called outer electrodes and are electrically and mechanically connected to a wiring board via a joining material such as solder and the like. On the other hand, the first conductor layer 12a and the second conductor layer 12b define and function as so-called internal electrode layers.

The multilayer ceramic capacitor 1C according to the present preferred embodiment is also a multilayer capacitor of a type that is typically referred to as a feed-through capacitor, and an equivalent circuit thereof is such as depicted in FIG. 6. In a case where the multilayer ceramic capacitor 1C is used as a decoupling capacitor to be installed in a DC/DC converter, the first to fourth outer connectors 21 to 24 are electrically connected to a power line, and the fifth to eighth outer connectors 25 to 28 are each electrically connected to ground (ground line).

Here, with reference to FIG. 39 to FIG. 42, also in the multilayer ceramic capacitor 1C according to the present preferred embodiment, various dimensions (in other words, the maximum external dimensions L0, W0, H0 and the dimensions L1, W1, and H1) are adjusted so as to satisfy all the first to sixth conditions. As is the case with the outer connectors in the Preferred Embodiment 1, the outer connectors in the present preferred embodiment are respectively provided on the first to fourth side surfaces. Accordingly, in the case where the configuration such as described in the present preferred embodiment is adopted, the occurrence of audible noise is significantly reduced or prevented without reducing flexibility in circuit board designing, as is the case where the configuration such as described in Preferred Embodiment 1 is adopted.

Figure 43:
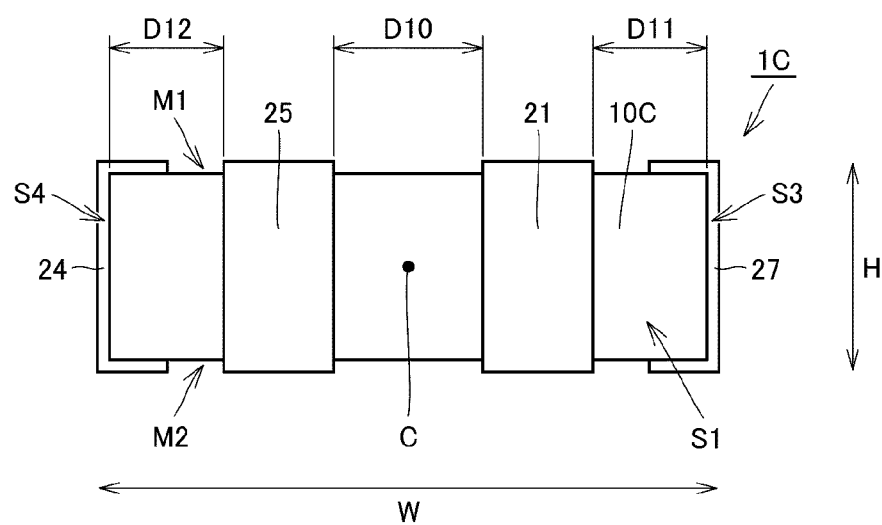
FIG. 43 is a side view for describing a preferred position arrangement of outer connectors in the multilayer ceramic capacitor depicted in FIG. 38.

FIG. 43 is a side view for describing a preferred position arrangement of outer connectors in the multilayer ceramic capacitor depicted in FIG. 38. Hereinafter, with reference to FIG. 43, the preferred position arrangement of outer connectors in the present preferred embodiment is described. FIG. 43 is a side view when the first side surface S1 is viewed from front. It is preferable that the second to fourth side surfaces S2 to S4 are also configured based on the configuration of the first side surface S1. All distances described below are the minimum distances between portions in the width direction W.

With reference to FIG. 43, it is preferable that, in the multilayer ceramic capacitor 1C according to the present preferred embodiment, the center position C of the first side surface S1 is exposed. According to such configuration, of the first side surface S1, the center position C where the largest distortion occurs when voltage is applied to the multilayer ceramic capacitor 1C is not covered with the first and fifth outer connectors 21 and 25. This reduces vibration propagating to the wiring board, making it possible to significantly reduce or prevent the occurrence of audible noise.

Furthermore, in that case, it is preferable that distance D10 is made larger, where the distance D10 is the distance between the first outer connector 21 and the fifth outer connector 25 in the width direction W (in other words, the maximum dimension of a center portion of the first side surface S1 in the width direction W, the center portion being one at the center of three portions where the first side surface S1 is exposed). For example, the occurrence of audible noise is effectively reduced or prevented by making the distance D10 larger than distance D11 and distance D12 (in other words, D11<D10 and D12<D10). The distance D11 is a distance between the first outer connector 21 and the third side surface S3 in the width direction W (in other words, the maximum dimension in the width direction W of a portion that is one of the three portions exposing the first side surface S1 and closest to the third side surface S3). The distance D12 is a distance between the first outer connector 21 and the fourth side surface S4 in the width direction W (in other words, the maximum dimension in the width direction W of a portion that is one of the three portions where the first side surface S1 is exposed and is closest to the fourth side surface S4).

In the multilayer ceramic capacitor 1C according to the present preferred embodiment, the extended portion 12a1 and the extended portion 12b1 are arranged in parallel or substantially in parallel and close to each other at a portion where the first and second conductor layers 12a and 12b are being extended to one of the first to fourth side surfaces S1 to S4. Accordingly, by configuring such as the multilayer ceramic capacitor 1C according to the present preferred embodiment, the directions of currents flowing through these portions become opposite to each other when voltage is applied. Thus, a reduction effect of equivalent series inductance (ESL) that is a parasitic component the multilayer capacitor is also provided.

Method of Measuring Dimensions of Respective Portions

Hereinafter, a method of measuring dimensions of respective portions of the multilayer ceramic capacitor is described.

Of the dimensions of respective portions of a multilayer ceramic capacitor, the maximum external dimensions L0, W0, and H0 of the multilayer ceramic capacitor in the length direction L, the width direction W, and the height direction H may be measured by measuring with a micrometer or by observing with an optical microscope. To measure these maximum external dimensions L0, W0, and H0 with a higher degree of precision, one of a L-H cross section, a W-H cross section, and a L-W cross section, which pass through substantially the center of a capacitor body, may be selected as a cross section to be exposed by grinding, and each exposed cross section may be observed with an optical microscope to obtain the corresponding external dimension along a straight line passing through substantially the center of the capacitor body in the length direction L, the width direction W, or the height direction H.

Of the dimensions of respective portions of the multilayer ceramic capacitor, the dimensions L1, W1, and H1 of an effective portion in the length direction L, the width direction W, and the height direction H may be measured by selecting one of the L-H cross section, the W-H cross section, and the L-W cross section, which pass through substantially the center of the capacitor body, as a cross section to be exposed by grinding, and by observing each exposed cross section with an optical microscope to obtain the corresponding dimension of the effective portion along the straight line passing through substantially the center of the capacitor body in the length direction L, the width direction W, or the height direction H.

The preferred embodiments disclosed herein are exemplary in all aspects and are not restrictive. The technical scope of the present invention is defined by the claims and includes all variations which come within the meaning and range of equivalency of description of the claims.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer capacitor comprising:
a capacitor body; and a plurality of outer connectors provided on outer surfaces of the capacitor body; wherein the capacitor body includes a plurality of dielectric layers and a plurality of conductor layers stacked alternatingly along a height direction;

the capacitor body includes a first principal surface and a second principal surface that face each other in the height direction, a first side surface and a second side surface that face each other in a length direction that is perpendicular or substantially perpendicular to the height direction, and a third side surface and a fourth side surface that face each other in a width direction that is perpendicular or substantially perpendicular to the height direction and the length direction;

the plurality of outer connectors includes:
  a first outer connector that covers a first portion of the first side surface, a first portion of the third side surface, and a first portion of at least one of the first and second principal surfaces;
  a second outer connector that covers a first portion of the second side surface, a first portion of the fourth side surface, and a second portion of at least one of the first and second principal surfaces;
  a third outer connector that covers a second portion of the second side surface, a second portion of the third side surface, and a third portion of at least one of the first and second principal surfaces; and
  a fourth outer connector that covers a second portion of the first side surface, a second portion of the fourth side surface, and a fourth portion of at least one of the first and second principal surfaces;

the plurality of conductor layers includes a plurality of first conductor layers connected to the first and second outer connectors and a plurality of second conductor layers connected to the third and fourth outer connectors;

the capacitor body includes an effective portion defined by electrostatic capacitance portions stacked along the height direction, each of the electrostatic capacitance portions being defined by one of the plurality of first conductor layers and one of the plurality of second conductor layers being disposed opposite to each other with one of the plurality of dielectric layers interposed therebetween;

in a case where L0 is a maximum external dimension of the multilayer capacitor in the length direction, W0 is a maximum external dimension of the multilayer capacitor in the width direction, and H0 is a maximum external dimension of the multilayer capacitor in the height direction, L0, W0, and H0 satisfy a condition of $2.67 \leq L0/H0$ and further satisfy a condition of $1/1.72 \leq L0/W0 \leq 1.72$; and the effective portion overlaps with one or more of portions of the first, second, third, and fourth outer connectors that cover one or more of the first, second, third and fourth portions of the at least one of the first principal surface and the second principal surface when viewed in the height direction.

2. The multilayer capacitor according to claim 1, wherein
the first outer connector covers the first portion of the first principal surface and the first portion of the second principal surface in addition to the first portion of the first side surface;
the second outer connector covers the second portion of the first principal surface and the second portion of the second principal surface in addition to the first portion of the second side surface;
the third outer connector covers the third portion of the first principal surface and the third portion of the second principal surface in addition to the second portion of the third side surface; and
the fourth outer connector covers the fourth portion of the first principal surface and the fourth portion of the second principal surface in addition to the second portion of the fourth side surface.

3. The multilayer capacitor according to claim 1, wherein
a centerline of a portion of the first outer connector in the width direction is spaced from a center position of the first side surface, the portion of the first outer connector covering the first side surface; and
a centerline of a portion of the second outer connector in the width direction is spaced from a center position of the second side surface, the portion of the second outer connector covering the second side surface.

4. The multilayer capacitor according to claim 1, wherein
a centerline of a portion of the third outer connector in the length direction is spaced from a center position of the third side surface, the portion of the third outer connector covering the third side surface; and
a centerline of a portion of the fourth outer connector in the length direction is spaced from a center position of the fourth side surface, the portion of the fourth outer connector covering the fourth side surface.

5. The multilayer capacitor according to claim 1, wherein
in a case where L1 is a dimension of the effective portion in the length direction and H1 is a dimension of the effective portion in the height direction, L1 and H1 satisfy a condition of $L0/H0 < L1/H1 < 1.35 \times (L0/H0)$.

6. The multilayer capacitor according to claim 5, wherein
in a case where W1 is a dimension of the effective portion in the width direction, W1 satisfies a condition of $W0/H0 < W1/H1 < 1.35 \times (W0/H0)$.

7. The multilayer capacitor according to claim 1, wherein
in a case where L1 is a dimension of the effective portion in the length direction and H1 is a dimension of the effective portion in the height direction, L1 and H1 satisfy a condition of $1.14 \times (L0/H0) \leq L1/H1 \leq 1.27 \times (L0/H0)$.

8. The multilayer capacitor according to claim 7, wherein
in a case where W1 is a dimension of the effective portion in the width direction, W1 satisfies a condition of $1.14 \times (W0/H0) \leq W1/H1 \leq 1.27 \times (W0/H0)$.

* * * * *